(12) United States Patent
Isobe et al.

(10) Patent No.: US 8,748,241 B2
(45) Date of Patent: Jun. 10, 2014

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Atsuo Isobe, Isehara (JP); Yutaka Okazaki, Isehara (JP); Kazuya Hanaoka, Fujisawa (JP); Shinya Sasagawa, Chigasaki (JP); Motomu Kurata, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/716,899

(22) Filed: Dec. 17, 2012

(65) Prior Publication Data

US 2013/0161621 A1    Jun. 27, 2013

(30) Foreign Application Priority Data

Dec. 23, 2011    (JP) .................. 2011-282450

(51) Int. Cl.
H01L 21/339    (2006.01)
H01L 21/00    (2006.01)
H01L 21/84    (2006.01)
H01L 21/76    (2006.01)

(52) U.S. Cl.
USPC .............. 438/151; 438/149; 438/48; 438/72; 438/443

(58) Field of Classification Search
USPC ......... 438/149, 151, 48, 57, 66, 80, 128, 157, 438/283, 443, 72, 59
See application file for complete search history.

(56) References Cited

U.S. PATENT DOCUMENTS 5,528,032 A    6/1996    Uchiyama
5,731,856 A    3/1998    Kim et al.

(Continued)

FOREIGN PATENT DOCUMENTS

EP    1737044 A    12/2006
EP    2226847 A    9/2010

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Chuong A. Luu
(74) *Attorney, Agent, or Firm* — Eric J. Robinson; Robinson Intellectual Property Law Office, P.C.

(57) ABSTRACT

A first conductive film overlapping with an oxide semiconductor film is formed over a gate insulating film, a gate electrode is formed by selectively etching the first conductive film using a resist subjected to electron beam exposure, a first insulating film is formed over the gate insulating film and the gate electrode, removing a part of the first insulating film while the gate electrode is not exposed, an anti-reflective film is formed over the first insulating film, the anti-reflective film, the first insulating film and the gate insulating film are selectively etched using a resist subjected to electron beam exposure, and a source electrode in contact with one end of the oxide semiconductor film and one end of the first insulating film and a drain electrode in contact with the other end of the oxide semiconductor film and the other end of the first insulating film are formed.

19 Claims, 12 Drawing Sheets

(56) References Cited

U.S. PATENT DOCUMENTS

| | | | |
|---|---|---|---|
| 5,744,864 A | 4/1998 | Cillessen et al. | |
| 6,242,343 B1 | 6/2001 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 * | 3/2010 | Akimoto et al. | 438/104 |
| 7,732,819 B2 * | 6/2010 | Akimoto et al. | 257/72 |
| 7,791,072 B2 | 9/2010 | Kumomi et al. | |
| 7,910,490 B2 | 3/2011 | Akimoto et al. | |
| 7,932,521 B2 | 4/2011 | Akimoto et al. | |
| 7,955,907 B2 | 6/2011 | Yamazaki et al. | |
| 8,003,981 B2 | 8/2011 | Iwasaki et al. | |
| 8,164,090 B2 | 4/2012 | Iwasaki et al. | |
| 8,207,025 B2 | 6/2012 | Suzawa et al. | |
| 8,237,166 B2 | 8/2012 | Kumomi et al. | |
| 8,247,813 B2 | 8/2012 | Koyama et al. | |
| 8,488,077 B2 * | 7/2013 | Yamazaki et al. | 349/43 |
| 8,493,766 B2 * | 7/2013 | Kawae | 365/72 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0062344 A1 | 3/2008 | Yoshimoto | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2011/0089417 A1 | 4/2011 | Yamazaki et al. | |
| 2011/0092017 A1 | 4/2011 | Akimoto et al. | |
| 2011/0101351 A1 | 5/2011 | Yamazaki | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0122670 A1 | 5/2011 | Yamazaki et al. | |
| 2011/0136301 A1 | 6/2011 | Yamazaki et al. | |
| 2011/0136302 A1 | 6/2011 | Yamazaki et al. | |
| 2011/0156022 A1 | 6/2011 | Yamazaki et al. | |
| 2011/0163311 A1 | 7/2011 | Akimoto et al. | |
| 2011/0175087 A1 | 7/2011 | Yamazaki et al. | |
| 2011/0180796 A1 | 7/2011 | Yamazaki et al. | |
| 2011/0193080 A1 | 8/2011 | Yamazaki et al. | |
| 2011/0204362 A1 | 8/2011 | Akimoto et al. | |
| 2011/0212569 A1 | 9/2011 | Yamazaki et al. | |
| 2011/0212570 A1 | 9/2011 | Yamazaki et al. | |
| 2011/0250724 A1 | 10/2011 | Suzawa et al. | |
| 2011/0260171 A1 | 10/2011 | Yamazaki | |
| 2011/0263082 A1 | 10/2011 | Yamazaki | |
| 2011/0263083 A1 | 10/2011 | Yamazaki | |
| 2011/0263084 A1 | 10/2011 | Yamazaki | |
| 2011/0263085 A1 | 10/2011 | Yamazaki | |
| 2011/0263091 A1 | 10/2011 | Yamazaki | |
| 2011/0269266 A1 | 11/2011 | Yamazaki | |
| 2012/0018727 A1 | 1/2012 | Endo et al. | |
| 2012/0032161 A1 | 2/2012 | Matsubayashi | |
| 2012/0034743 A1 | 2/2012 | Suzawa et al. | |
| 2012/0061670 A1 | 3/2012 | Suzawa et al. | |
| 2012/0112184 A1 | 5/2012 | Yamazaki et al. | |
| 2012/0146019 A1 | 6/2012 | Yamazaki et al. | |
| 2012/0149147 A1 | 6/2012 | Yamazaki et al. | |
| 2012/0161121 A1 | 6/2012 | Yamazaki | |
| 2012/0161123 A1 | 6/2012 | Yamazaki | |
| 2012/0161124 A1 | 6/2012 | Yamazaki | |
| 2012/0161126 A1 | 6/2012 | Yamazaki | |
| 2012/0187397 A1 * | 7/2012 | Yamazaki et al. | 257/43 |
| 2012/0280230 A1 | 11/2012 | Akimoto et al. | |

(56) References Cited

U.S. PATENT DOCUMENTS

| | | |
|---|---|---|
| 2013/0075732 A1 | 3/2013 | Saito et al. |
| 2013/0140554 A1 | 6/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-216069 | 8/1993 |
| JP | 05-251705 A | 9/1993 |
| JP | 06-275697 | 9/1994 |
| JP | 08-264794 A | 10/1996 |
| JP | 11-074526 | 3/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2006-286772 | 10/2006 |
| JP | 2007-096055 A | 4/2007 |
| JP | 2009-224479 A | 10/2009 |
| JP | 2010-192660 | 9/2010 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1966, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 ; SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No 1, pp. 292-299.

OHara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its

(56) References Cited

OTHER PUBLICATIONS

Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performane TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

OHara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Dispay Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YbFe2O4, and Yb2Fe3O7 Types of Structures for Compounds in the In2O3 and Sc2O3-A2O3-BO Systems [A; Fe, Ga, Or Al; B: Mg, Mn, Fe, Ni, Cu, or Zn], at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 626-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Joural of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physica Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Morosawa.N et al., "35.3: Distinguished Paper: A Novel Self-Aligned Top-Gate Oxide TFT for AM-OLED Displays." SID Digest '11 :SID International Symposium Digest of Technical Papers, May 17, 2011, pp. 479-482.

Ihun Song et al., "Short Channel Characteristics of Gallium—Indium—Zinc—Oxide Thin Film Transistors for Three-Dimensional Stacking Memory," IEEE Electron Device Letters, vol. 29, No. 6, Jun. 2008, pp, 549-552.

* cited by examiner

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

In this specification, a semiconductor device generally refers to a device which can function by utilizing semiconductor characteristics, and an electrooptic device, a semiconductor circuit, and electronic equipment are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide containing indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

In order to achieve high-speed operation, low power consumption, high integration, or the like of a transistor, it is necessary to miniaturize a transistor.

One object of an embodiment of the present invention is to provide a structure of a semiconductor device which achieves high-speed response and high-speed operation by improving on-state characteristics of a miniaturized transistor (e.g., on-state current or field-effect mobility), and to provide a manufacturing method thereof, in order to achieve a high-performance semiconductor device.

Further, in accordance with miniaturization of the transistor, concern about a decrease in yield of a manufacturing process rises.

Accordingly, it is another object to provide a minute transistor having high electric characteristics with high yield.

Further, another object of an embodiment of the present invention is to achieve high performance, high reliability, and high productivity also in the semiconductor device including the transistor.

In a semiconductor device including a transistor in which an oxide semiconductor film, a gate insulating film, and a gate electrode on side surfaces and a top surface of which a first insulating film is provided are stacked in this order, a source electrode and a drain electrode are provided in contact with the oxide semiconductor film and the first insulating film. In a process for manufacturing the semiconductor device, a conductive film and a second insulating film are stacked to cover the oxide semiconductor film, the first insulating film, and the gate electrode. Then, the second insulating film and the conductive film are removed (or polished), so that the conductive film over the gate electrode is removed. Accordingly, a source electrode and a drain electrode are formed. As the removing (or polishing) method, a chemical mechanical polishing (CMP) method can be preferably used.

Further, an insulating film (a sidewall insulating film) on a side surface of a gate electrode is formed using a resist mask, and the height of a gate electrode region becomes high by using the insulating film at the same time. Here, the "height of a gate electrode region" in this specification refers to the height from a bottom surface of a gate electrode to a top surface of a film which is in contact with the gate electrode. The height of the gate electrode region is high, whereby the source electrode and the drain electrode can be easily separated from each other.

Further, when a resist mask having a miniaturized line formed by exposing a resist to an electron beam is used, a channel length can be shortened. In consideration of etching selectivity of films to each other which are to be deposited, specifically, a hard mask film is provided over a conductive film, a resist formed on the hard mask film is exposed to an electron beam, the hard mask film is etched using the developed resist mask as an etching mask, the conductive film is etched using the etched hard mask film as a mask, so that a gate electrode is formed. A region overlapping with the gate electrode in the oxide semiconductor film becomes a channel formation region of a transistor.

One embodiment of the present invention is a semiconductor device including an oxide semiconductor film over an insulating surface, a gate insulating film over the oxide semiconductor film, a gate electrode provided over the gate insulating film and overlapping with the oxide semiconductor film, a first insulating film over the gate insulating film and the gate electrode, a source electrode in contact with one end of the oxide semiconductor film and one end of the first insulating film, a drain electrode in contact with the other end of the oxide semiconductor film and the other end of the first insulating film, and a second insulating film over the source electrode and the drain electrode. Heights of top surfaces of the source electrode and the drain electrode are substantially the same as heights of top surfaces of the first insulating film and the second insulating film. A channel length of the oxide semiconductor film is greater than or equal to 1 nm and less than or equal to 30 nm.

Another embodiment of the present invention is a semiconductor device including an oxide semiconductor film provided over an insulating surface and including a channel formation region, and a first low-resistance region and a second low-resistance region with the channel formation region sandwiched therebetween, a gate insulating film over the oxide semiconductor film, a gate electrode provided over the gate insulating film and overlapping with the channel formation region, a first insulating film over the gate insulating film and the gate electrode, a source electrode in contact with a part of the first low-resistance region, a drain electrode in contact with a part of the second low-resistance region, and a second insulating film over the source electrode and the drain electrode. Heights of top surfaces of the source electrode and the drain electrode are substantially the same as heights of top surfaces of the first insulating film and the second insulating film. A channel length of the oxide semiconductor film is greater than or equal to 1 nm and less than or equal to 30 nm.

Another embodiment of the present invention is a method for manufacturing a semiconductor device including the steps of forming an oxide semiconductor film over an insulating surface, forming a gate insulating film covering the oxide semiconductor film, forming a first conductive film provided over the gate insulating film and overlapping with the oxide semiconductor film, forming a hard mask film over the first conductive film, forming a first resist by performing electron beam exposure over the hard mask film, selectively etching the hard mask film, forming a gate electrode by selectively etching the first conductive film using the etched hard mask film as a mask, forming a first insulating film over the gate insulating film and the gate electrode, performing removing treatment on a part of the first insulating film while the gate electrode is not exposed, forming an anti-reflective film over the first insulating film subjected to the removing treatment, forming a second resist by performing electron beam exposure provided over the anti-reflective film and overlapping with the oxide semiconductor film, exposing parts of the insulating surface and the oxide semiconductor film by selectively etching the anti-reflective film, the first insulating film, and the gate insulating film, forming a second conductive film over the exposed insulating surface, oxide semiconductor film, and anti-reflective film, forming a second insulating film over the second conductive film, performing removing treatment on parts of the second insulating film and the second conductive film, and the anti-reflective film so that the first insulating film is exposed, and forming a source electrode and a drain electrode by processing the second conductive film subjected to the removing treatment.

Another embodiment of the present invention is a method for manufacturing a semiconductor device including the steps of forming an oxide semiconductor film over an insulating surface, forming a gate insulating film covering the oxide semiconductor film, forming a first conductive film provided over the gate insulating film and overlapping with the oxide semiconductor film, forming a hard mask film over the first conductive film, forming a first resist by performing electron beam exposure over the hard mask film, selectively etching the hard mask film, forming a gate electrode by selectively etching the first conductive film using the etched hard mask film as a mask, forming, in a self-aligned manner, a channel formation region in a region overlapping with the gate electrode in the oxide semiconductor film and a first low-resistance region and a second low-resistance region between which the channel formation region is sandwiched in the oxide semiconductor film by adding impurities, forming a first insulating film over the gate insulating film and the gate electrode, performing removing treatment on a part of the first insulating film while the gate electrode is not exposed, forming an anti-reflective film over the first insulating film on which the removing treatment is performed, forming a second resist provided by performing electron beam exposure over the anti-reflective film and overlapping with the channel formation region, the first low-resistance region, and the second low-resistance region, exposing parts of the insulating surface, the first low-resistance region, and the second low-resistance region by selectively etching the anti-reflective film, the first insulating film, and the gate insulating film, forming a second conductive film over the exposed insulating surface, first low-resistance region, and second low-resistance region, and the anti-reflective film, forming a second insulating film over the second conductive film, performing removing treatment on parts of the second insulating film and the second conductive film, and the anti-reflective film so that the first insulating film is exposed, and forming a source electrode and a drain electrode by processing the second conductive film on which the removing treatment is performed.

According to one embodiment of the present invention, in the above manufacturing method, the removing treatment is preferably performed by chemical mechanical polishing.

According to one embodiment of the present invention, in the above manufacturing method, the hard mask film is preferably a stacked film of a silicon nitride oxide film and an amorphous silicon film or a stacked film of a silicon oxide film and an amorphous silicon film.

According to one embodiment of the present invention, in the above manufacturing method, a second hard mask film is formed after the anti-reflective film is formed and before the second resist is formed. The second hard mask film is preferably a stacked film of a silicon nitride oxide film and an amorphous silicon film or a stacked film of a silicon oxide film and an amorphous silicon film.

According to one embodiment of the present invention, in the above manufacturing method, a channel length of the oxide semiconductor film is determined by electron beam exposure.

The oxide semiconductor film is preferably highly purified so as to contain hardly any impurities such as copper, aluminum, and chlorine. In the process for manufacturing the transistor, steps in which these impurities are not mixed or attached to the surface of the oxide semiconductor film are preferably selected as appropriate. In the case where the impurities are attached to the surface of the oxide semiconductor film, the impurities on the surface of the oxide semiconductor film are preferably removed by exposure to oxalic acid, dilute hydrofluoric acid, or the like or by plasma treatment (such as $N_2O$ plasma treatment). Specifically, the copper concentration of the oxide semiconductor film is lower than or equal to $1 \times 10^{18}$ atoms/cm$^3$, preferably lower than or equal to $1 \times 10^{17}$ atoms/cm$^3$. In addition, the aluminum concentration of the oxide semiconductor film is lower than or equal to $1 \times 10^{18}$ atoms/cm$^3$. Further, the chlorine concentration of the oxide semiconductor film is lower than or equal to $2 \times 10^{18}$ atoms/cm$^3$.

In addition, shortly after the oxide semiconductor film is formed, it is preferable that the oxide semiconductor film contains oxygen in a proportion higher than that in the stoichiometric composition, i.e., the oxide semiconductor film is supersaturated. For example, in the case where the oxide semiconductor film is formed by a sputtering method, the formation is preferably performed in the state where the proportion of oxygen in a film formation gas is large, and in particular, the formation is preferably performed in an oxygen atmosphere (an oxygen gas: 100%). When the formation is performed in the state where the proportion of oxygen in the film formation gas is large, particularly in a 100% oxygen gas atmosphere, release of Zn from the film can be reduced even at a film formation temperature higher than or equal to 300° C., for example.

The oxide semiconductor film is preferably an oxide semiconductor film which is purified by sufficient removal of impurities such as hydrogen or by sufficient supply of oxygen so as to be supersaturated with oxygen. Specifically, the hydrogen concentration of the oxide semiconductor film is $5 \times 10^{19}$ atoms/cm$^3$ or less, preferably $5 \times 10^{18}$ atoms/cm$^3$ or less, more preferably $5 \times 10^{17}$ atoms/cm$^3$ or less. Note that the above hydrogen concentration of the oxide semiconductor film is measured by secondary ion mass spectrometry (SIMS). In order that the oxide semiconductor film is supersaturated with oxygen by sufficient supply of oxygen, an insulating film containing excess oxygen (such as a $SiO_x$ film) is provided so as to cover and be in contact with the oxide semiconductor film.

As the insulating film containing excess oxygen, a $SiO_x$ or silicon oxynitride film containing much oxygen as a result of film formation under the conditions which are set as appropriate for a plasma CVD method or a sputtering method is used. In order to make the insulating film contain much more excess oxygen, oxygen is added by an ion implantation method, an ion doping method, or plasma treatment.

In the case where the hydrogen concentration of the insulating film containing excess oxygen is greater than or equal to $7.2 \times 10^{20}$ atoms/cm$^3$, variation in initial characteristics of transistors is increased, a channel length dependence is increased, and a transistor is significantly deteriorated in the BT stress test; therefore, the hydrogen concentration of the insulating film containing excess oxygen should be less than $7.2 \times 10^{20}$ atoms/cm$^3$. In other words, the hydrogen concentration of the oxide semiconductor film is preferably less than or equal to $5 \times 10^{19}$ atoms/cm$^3$, and the hydrogen concentration of the insulating film containing excess oxygen is preferably less than $7.2 \times 10^{20}$ atoms/cm$^3$.

In addition, a blocking film (such as an AlO$_x$ film) for preventing oxygen from being released from the oxide semiconductor film is preferably provided so as to be positioned outside the insulating film containing excess oxygen.

When the oxide semiconductor film is surrounded by the insulating film containing excess oxygen or the blocking film, the oxide semiconductor film can contain oxygen in a proportion higher than that in the stoichiometric composition i.e., the oxide semiconductor film can be supersaturated with oxygen. For example, in the case where the stoichiometric composition of the oxide semiconductor film is In:Ga:Zn:O=1:1:1:4 [atomic ratio], the ratio of oxygen atoms in the IGZO is larger than 4.

Accordingly, a minute transistor having high electric characteristics can be provided with high yield.

Moreover, a minute transistor having a short channel length can be achieved, whereby the operation speed of a circuit can be increased and power consumption can be reduced.

Further, also in a semiconductor device including the transistor, high performance, high reliability, and high productivity can be achieved.

DETAILED DESCRIPTION OF THE INVENTION

Figure 1A:
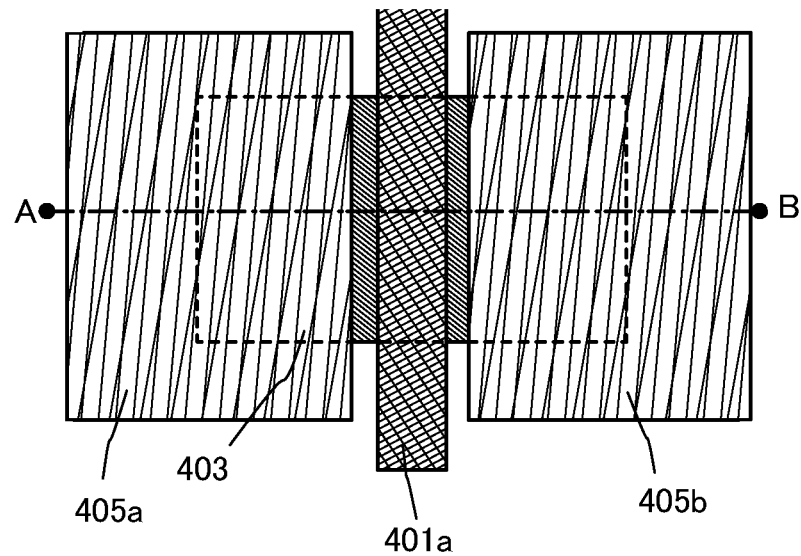
FIGS. 1A and 1B are a plan view and a cross-sectional view illustrating a semiconductor device according to one embodiment of the present invention.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Accordingly, the invention should not be construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases. In addition, for convenience, an insulating film is not illustrated in a top view in some cases.

Note that in this specification and the like, the term such as "over" or "below" does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are an electrode and a wiring.

Furthermore, hereinafter, ordinal numbers, such as "first" and "second," are used merely for convenience, and the present invention is not limited to the numbers.

Embodiment 1

In this embodiment, one embodiment of a semiconductor device and a method for manufacturing the semiconductor device, which is one embodiment of the present invention, will be described with reference to FIGS. 1A and 1B, FIGS. 2A to 2D, FIGS. 3A to 3D, and FIGS. 4A to 4D.

Figure 1B:
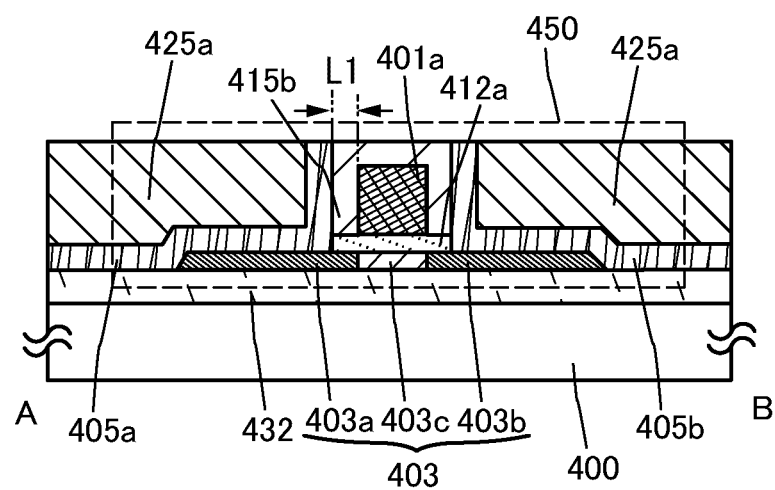

FIGS. 1A and 1B are a plan view and a cross-sectional view of a transistor 450. FIG. 1A is a plan view and FIG. 1B is a cross-sectional view taken along line A-B in FIG. 1A. Note that in FIG. 1A, some components (e.g., a base insulating film 432) of the transistor 450 are omitted to avoid complexity.

<Structure of Semiconductor Device According to this Embodiment>

FIGS. 1A and 1B are an example of a structure of a semiconductor device manufactured according to a method of this embodiment. The transistor 450 illustrated in FIGS. 1A and 1B includes a base insulating film 432 provided over a substrate 400 having an insulating surface, an oxide semiconductor film 403 including a channel formation region 403c and low-resistance regions 403a and 403b with the channel formation region 403c sandwiched therebetween over the base insulating film 432, a gate insulating film 412a over the oxide semiconductor film 403, a gate electrode 401a provided over the gate insulating film 412a and overlapping with the channel formation region 403c, an insulating film 415b over the gate insulating film 412a and the gate electrode 401a, a source electrode 405a overlapping with parts of the base insulating film 432 and the low-resistance region 403a, a drain electrode 405b overlapping with parts of the base insulating film 432 and the low-resistance region 403b, and an insulating film 425a over the source electrode 405a and the drain electrode 405b.

The insulating film 415b is provided over the gate electrode 401a, whereby the height of the gate electrode region becomes high and a sidewall insulating film can be formed on a side surface of a gate electrode 401a. Thus, when removing (polishing) treatment is performed on a part of a conductive film to be a source electrode and a drain electrode, the source electrode 405a and the drain electrode 405b can be easily separated from each other.

Further, the length of the gate electrode 401a in the channel length direction can be determined by exposure to an electron beam. Here, a portion in the oxide semiconductor film 403 overlapping with a region where the gate electrode 401a is formed becomes a channel formation region of the transistor. That is, since the channel length can be determined by the exposure to an electron beam, a transistor with a small channel length can be manufactured.

Further, the source electrode 405a and the drain electrode 405b are provided in contact with the exposed portion of a top surface of the oxide semiconductor film 403 and the insulating film 415b. Therefore, the distance L1 between the gate electrode 401a and the region (contact region) in which the oxide semiconductor film 403 is in contact with the source electrode 405a (or the drain electrode 405b) can be determined by the exposure to an electron beam, so that the resistance between the gate electrode 401a and the region (contact region) in which the oxide semiconductor film 403 is in contact with the source electrode 405a (or the drain electrode 405b) is reduced; thus, the on-state characteristics of the transistor 450 can be improved.

<Manufacturing Method of Semiconductor Device According to this Embodiment>

A method for manufacturing the transistor 450 will be described with reference to FIGS. 2A to 2D, FIGS. 3A to 3D, and FIGS. 4A and 4D.

Figure 2A:
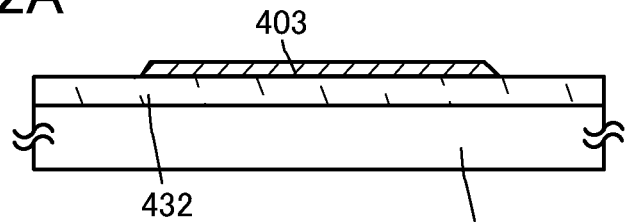
FIGS. 2A to 2D are cross-sectional views illustrating a manufacturing process of the semiconductor device according to one embodiment of the present invention.

First, the base insulating film 432 is formed over the substrate 400 and the oxide semiconductor film 403 is formed over the base insulating film 432 (see FIG. 2A).

For the substrate 400, a glass material such as aluminosilicate glass, aluminoborosilicate glass, or barium borosilicate glass is used. A single crystal semiconductor substrate or a polycrystalline semiconductor substrate made of silicon, silicon carbide, or the like; a compound semiconductor substrate made of silicon germanium or the like; an SOI (silicon on insulators) substrate; or the like can be used as the substrate 400, or the substrate provided with a semiconductor element can be used as the substrate 400.

The base insulating film 432 is formed by a plasma CVD method or a sputtering method to have a thickness greater than or equal to 50 nm and less than or equal to 2 μm with the use of one of a silicon oxide film, a gallium oxide film, an aluminum oxide film, a silicon nitride film, a silicon oxynitride film, an aluminum oxynitride film, and a silicon nitride oxide film or a stack of any of these films. The base insulating film 432 can prevent entry of impurities from the substrate 400 side. In the case where the base insulating film 432 is unnecessary, e.g., in the case where the amount of moisture adsorbed on a surface of the substrate 400 and the amount of moisture included in the substrate 400 are small, the base insulating film 432 is not necessarily provided.

It is preferable that an insulating film from which oxygen is released by heat treatment be used as the base insulating film 432.

Note that "oxygen is released by heat treatment" described above refers to an amount of released oxygen when converted into oxygen atoms in thermal desorption spectroscopy (TDS) analysis is greater than or equal to $1.0 \times 10^{19}$ atoms/cm$^3$, preferably greater than or equal to $3.0 \times 10^{19}$ atoms/cm$^3$, further preferably greater than or equal to $1.0 \times 10^{20}$ atoms/cm$^3$, still further preferably greater than or equal to $3.0 \times 10^{20}$ atoms/cm$^3$.

Here, a method in which the amount of released oxygen is measured by being converted into oxygen atoms using the TDS analysis is described below.

The released amount of gas in the TDS analysis is proportional to an integral value of spectrum. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the number of released oxygen molecules ($N_{O2}$) from an insulating film can be found according to Formula (I) with the TDS analysis results of a silicon wafer containing hydrogen at a predetermined density which is the standard sample and the TDS analysis results of the insulating film. Here, all spectra having a mass-to-charge ratio (M/z) of 32 which are obtained by the TDS analysis are assumed to originate from an oxygen molecule. CH$_3$OH, which is given as a gas where M/z=32, is not taken into consideration on the assumption that it is unlikely to be present. Further, an oxygen molecule including an oxygen atom where M/z=17 or 18 which is an isotope of an oxygen atom is not taken into consideration either because the proportion of such a molecule in the natural world is minimal.

[FORMULA 1]

$$N_{O2} = \frac{N_{H2}}{S_{H2}} \times S_{O2} \times \alpha \quad (1)$$

$N_{H2}$ is the value obtained by conversion of the number of hydrogen molecules desorbed from the standard sample into densities. $S_{H2}$ is the integral value of a spectrum when the standard sample is subjected to the TDS analysis. Here, the reference value of the standard sample is set to $N_{H2}/S_{H2}$. $S_{O2}$ is the integral value of a spectrum when the insulating film is subjected to the TDS analysis. $\alpha$ is a coefficient affecting the intensity of the spectrum in the TDS analysis. Refer to Japanese Published Patent Application No. H06-275697 for details of the Formula 1. Note that the amount of released oxygen from the above insulating film is measured with a thermal desorption spectroscopy apparatus produced by ESCO Ltd., EMD-WA1000S/W using a silicon wafer containing hydrogen atoms at $1\times10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α is determined with considering the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

Note that in this specification, "oxynitride" such as silicon oxynitride contains more oxygen than nitrogen.

Further, in this specification, "nitride oxide" such as silicon nitride oxide contains more nitrogen than oxygen.

Further, an aluminum oxide film is preferably provided between the substrate 400 and the base insulating film 432. In particular, it is preferable to use an aluminum oxide film with a film density of higher than or equal to 3.2 g/cm$^3$, preferably higher than or equal to 3.6 g/cm$^3$. The aluminum oxide film has a thickness greater than or equal to 30 nm and less than or equal to 150 nm, preferably greater than or equal to 50 nm and less than or equal to 100 nm. When the film density of the aluminum oxide film is within the above range, moisture or hydrogen can be prevented from entering and diffusing into the oxide semiconductor film. In addition, release of oxygen from the oxide semiconductor film 403 can be suppressed.

Hydrogen or water is preferably removed from the base insulating film 432 by heat treatment at a temperature lower than or equal to 650° C.

The oxide semiconductor film 403 can be formed by a sputtering method, a molecular beam epitaxy (MBE) method, a CVD method, a pulsed laser deposition method, an atomic layer deposition (ALD) method, or the like. The oxide semiconductor film 403 may be formed with the use of a sputtering apparatus which performs deposition in the state where top surfaces of a plurality of substrates are substantially perpendicular to a top surface of a sputtering target. In this embodiment, etching treatment is performed on the oxide semiconductor film 403 and the film is formed in an island shape; however, the prevent invention is not limited thereto.

In the formation of the oxide semiconductor film 403, the concentration of hydrogen contained in the oxide semiconductor film 403 is preferably reduced. In order to reduce the concentration of hydrogen contained in the oxide semiconductor film 403, for example, in the case where the oxide semiconductor film is formed by a sputtering method, a high-purity oxygen, a rare gas (typically, argon), or a mixed gas of oxygen and the rare gas from which impurities such as hydrogen, water, a hydroxyl group, or hydride have been removed is used as appropriate as an atmosphere gas supplied to a deposition chamber of a sputtering apparatus.

The oxide semiconductor film 403 is formed in such a manner that a sputtering gas from which hydrogen and moisture have been removed is introduced into a deposition chamber while moisture remaining in the deposition chamber is removed, whereby the concentration of hydrogen in the formed oxide semiconductor film 403 can be reduced. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. A cryopump has a high capability in removing a compound containing a hydrogen atom, such as a hydrogen molecule and water ($H_2O$) (preferably, also a compound containing a carbon atom), and the like; therefore, the concentration of impurities contained in the oxide semiconductor film 403 formed in the deposition chamber which is evacuated with a cryopump can be reduced.

Further, when the oxide semiconductor film 403 is formed by a sputtering method, the relative density (fill rate) of a metal oxide target that is used for forming the oxide semiconductor film 403 is greater than or equal to 90% and less than or equal to 100%, preferably greater than or equal to 95% and less than or equal to 99.9%. With the use of a metal oxide target with a high relative density, the formed oxide semiconductor film 403 can be dense.

As a material of the oxide semiconductor film 403, for example, an In—M—Zn—O-based material may be used. Here, a metal element M is an element whose bond energy with oxygen is higher than that of In and that of Zn. Alternatively, M is an element which has a function of suppressing desorption of oxygen from the In—M—Zn—O-based material. Owing to the effect of the metal element M, generation of oxygen vacancies in the oxide semiconductor film is suppressed. Therefore, change in electrical characteristics of the transistor, which is caused by oxygen vacancies, can be reduced; accordingly, a highly reliable transistor can be obtained.

The metal element M may be, specifically, Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. The metal element M may be formed using one or more elements selected from the above elements. Further, Si or Ge can be used instead of the metal element M.

Here, in the In—M—Zn—O-based material which is an oxide semiconductor, the higher the concentration of In is, the higher the carrier mobility and the carrier density are. As a result, the oxide semiconductor has higher conductivity as the concentration of In is higher.

The oxide semiconductor film 403 may have either a single-layer structure or a stacked structure. The oxide semiconductor film 403 may be in a single crystal state, a polycrystalline (also referred to as polycrystal) state, or an amorphous state.

In this embodiment, the oxide semiconductor film 403 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light is small. Thus, the transistor has high reliability.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the formation of the CAAC-OS film, the following conditions are preferably used.

By reducing the amount of impurities entering the CAAC-OS film during the film formation, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the film formation, migration of a sputtered particle is likely to occur after the sputtered particle reaches a substrate surface. Specifically, the substrate heating temperature during the film formation is higher than or equal to 100° C. and lower than or equal to 740° C., preferably higher than or equal to 200° C. and lower than or equal to 500° C. By increasing the substrate heating temperature during the film formation, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the film formation. The proportion of oxygen in the deposition gas is 30 vol % or higher, preferably 100 vol %.

As an example of the sputtering target, an In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

The oxide semiconductor film is preferably in a supersaturated state in which oxygen which exceeds the stoichiometric composition is contained just after its formation. For example, when an oxide semiconductor film is formed by a sputtering method, it is preferable that the film be formed in a film formation gas containing a high percentage of oxygen, and it is especially preferable that the film be formed under an oxygen atmosphere (oxygen gas 100%). When deposition is performed under such a condition that the ratio of oxygen to a deposition gas is high, particularly in an atmosphere containing oxygen at 100%, a release of Zn from the film can be suppressed at a deposition temperature even higher than or equal to 300° C.

It is preferable that the oxide semiconductor film be the one which is highly purified and hardly contain impurities such as copper, aluminum, and chlorine. In the process for manufacturing the transistor, steps in which these impurities are not mixed in the oxide semiconductor film or attached to the surface of the oxide semiconductor film are preferably selected as appropriate. In the case where the impurities are attached to the surface of the oxide semiconductor film, the impurities on the surface of the oxide semiconductor film are preferably removed by exposure to oxalic acid or dilute hydrofluoric acid or plasma treatment (such as $N_2O$ plasma treatment). Specifically, the concentration of copper in the oxide semiconductor film is lower than or equal to $1\times10^{18}$ atoms/cm$^3$, preferably lower than or equal to $1\times10^{17}$ atoms/cm$^3$. Further, the concentration of aluminum in the oxide semiconductor film is smaller than or equal to $1\times10^{18}$ atoms/cm$^3$. Further, the concentration of chlorine in the oxide semiconductor film is smaller than or equal to $2\times10^{18}$ atoms/cm$^3$.

The oxide semiconductor film is preferably highly purified by sufficient removal of impurities such as hydrogen or sufficient supply of oxygen to be in a supersaturated state. Specifically, the concentration of hydrogen in the oxide semiconductor film is $5\times10^{19}$ atoms/cm$^3$ or less, preferably $5\times10^{18}$ atoms/cm$^3$ or less, further preferably $5\times10^{17}$ atoms/cm$^3$ or less. Note that the concentration of hydrogen in the oxide semiconductor film is measured by secondary ion mass spectrometry (SIMS). Further, for sufficient supply of oxygen to make the film in a supersaturated state, an insulating film (e.g., $SiO_x$) containing excess oxygen is provided to be in contact with and covers the oxide semiconductor film.

Figure 2B:
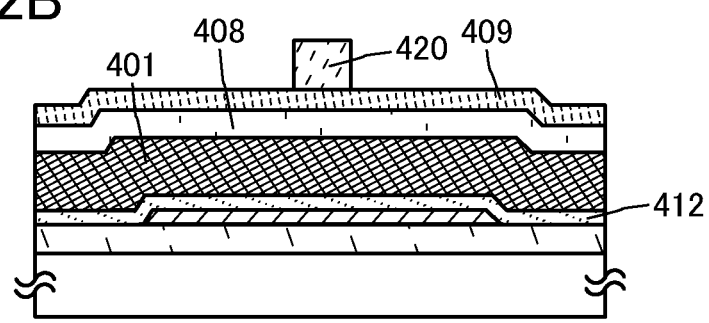

Next, a gate insulating film 412 is formed over the base insulating film 432 and the oxide semiconductor film 403 (see FIG. 2B). Note that the gate insulating film 412 may be provided at least between the gate electrode 401a to be formed later and the oxide semiconductor film 403.

As a material for the gate insulating film 412, silicon oxide, gallium oxide, aluminum oxide, zirconium oxide, yttrium oxide, hafnium oxide, lanthanum oxide, neodymium oxide, tantalum oxide, silicon nitride, silicon oxynitride, aluminum oxynitride, silicon nitride oxide, or the like can be used.

As the gate insulating film 412, an insulating film which releases oxygen by heat treatment at a temperature higher than or equal to 250° C. and lower than or equal to 700° C., preferably higher than or equal to 300° C. and lower than or equal to 450° C. may be used.

In a transistor including an oxide semiconductor film, oxygen vacancies in the oxide semiconductor film serve as donors, which cause a shift of the threshold voltage of the transistor in the negative direction. Oxygen vacancies at an interface between a gate insulating film and the oxide semiconductor film are a major factor of change in electric characteristics of the transistor, because electrons are captured due to an operation of the transistor or the like. Therefore, reduction in oxygen vacancies in the oxide semiconductor film and at the interface between the oxide semiconductor film and the gate insulating film leads to stable electric characteristics of the transistor including the oxide semiconductor film and improvement in reliability. Therefore, when oxygen is released from the gate insulating film, oxygen vacancies in the oxide semiconductor film and at the interface between the oxide semiconductor film and the gate insulating film can be reduced.

Next, the substrate 400 over which the gate insulating film 412 is formed may be subjected to heat treatment for removing moisture, hydrogen, and the like.

For the heat treatment, an electric furnace or a device for heating an object by heat conduction or heat radiation from a heating element such as a resistance heating element can be used. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA treatment may be performed as follows. The object to be processed is put in a heated inert gas atmosphere, heated for several minutes, and taken out of the inert gas atmosphere. The GRTA treatment enables high-temperature heat treatment for a short time. Moreover, the GRTA treatment can be employed even when the temperature exceeds the upper temperature limit of the object to be processed. Note that the inert gas may be changed during the treatment to a gas including oxygen. The heat treatment is performed in an atmosphere including oxygen, whereby the defect density in the film can be decreased.

Note that as the inert gas atmosphere, an atmosphere that contains nitrogen or a rare gas (e.g., helium, neon, or argon) as its main component and does not include moisture, hydrogen, or the like is preferably used. For example, the purity of nitrogen or a rare gas such as helium, neon, or argon introduced into the heat treatment apparatus is higher than or equal to 6N (99.9999%), preferably higher than or equal to 7N (99.99999%) (that is, the impurity concentration is lower than or equal to 1 ppm, preferably lower than or equal to 0.1 ppm).

In the case where the mother glass is used as the substrate 400, high process temperature and a long period of process time drastically shrink the mother glass; therefore, the temperature of the heat treatment is higher than or equal to 200° C. and lower than or equal to 450° C., preferably higher than or equal to 250° C. and lower than or equal to 350° C.

Impurities such as moisture or hydrogen in the gate insulating film 412 can be removed by the heat treatment. Further, by the heat treatment, the defect density in the films can be reduced. The impurities or defect density in the gate insulating film 412 is reduced, whereby the electric characteristics of the transistor can be improved and the change in the electric characteristics of the transistor due to the operation of the transistor or the like can be suppressed.

The above heat treatment can be referred to as dehydration treatment, dehydrogenation treatment, or the like because of its advantageous effect of removing moisture, hydrogen, or the like. Such dehydration treatment or dehydrogenation treatment may be performed once or plural times.

Then, a conductive film 401 is formed over the gate insulating film 412 (see FIG. 2B).

The conductive film 401 may be formed to have a single-layer or stacked-layer structure using one or more of Al, Ti, Cr, Co, Ni, Cu, Y, Zr, Mo, Ag, Ta, and W, a nitride of any of these elements, an oxide of any of these elements, and an alloy of any of these elements. Alternatively, an oxide or an oxynitride which contains at least In and Zn may be used. For example, an In—Ga—Zn—O—N-based material can be used. In this embodiment, a tantalum nitride film having a thickness of 30 nm is formed and a tungsten film having a thickness of 200 nm is formed over the tantalum nitride film.

A resist mask which is to be formed later by the exposure to an electron beam is thin and it is difficult to form a pattern of the conductive film 401 in some cases. Therefore, a hard mask film 408 is formed over the conductive film 401, a hard mask film 409 is formed over the hard mask film 408, and the hard masks are used as a mask (see FIG. 2B).

It is preferable that the hard mask film 408 not be easily etched under conditions where the conductive film 401 is etched, because the hard mask film 408 is used as a mask when the conductive film 401 is etched. As the hard mask film 408, a silicon oxide film or a silicon nitride oxide film is preferably used.

Further, it is preferable that the hard mask film 409 be not easily etched under conditions where the hard mask film 408 is etched, because the hard mask film 409 is used as a mask when the hard mask film 408 is etched. As the hard mask film 409, an amorphous silicon film is preferably used.

Etching selectivity of the hard mask film 409 to a resist mask formed by the exposure to the electron beam is high; therefore it is easy to form a pattern even if the resist mask is thin. Further, etching selectivity of the hard mask film 408 to the hard mask film 409 and etching selectivity of the conductive film 401 (the tungsten film of the upper layer in this embodiment) to the hard mask film 408 are high; therefore, it is easy to form pattern of the lower layer by using the patterned film thereover as a mask.

Next, a resist is formed over the hard mask film 409 and subjected to exposure to an electron beam; thus, a resist mask 420 is formed (see FIG. 2B).

In an electron beam writing apparatus capable of electron beam irradiation, the acceleration voltage is preferably in the range from 5 kV to 50 kV, for example. The current intensity is preferably in the range from $5\times10^{-12}$ A to $1\times10^{-11}$ A. The minimum beam size is preferably 2 nm or less. The minimum possible pattern line width is preferably 8 nm or less.

Under the above conditions, the resist mask 420 with a width of, for example, 1 nm or more and 30 nm or less, preferably 20 nm or less, more preferably 8 nm or less, can be obtained.

For the exposure to an electron beam, the resist mask 420 is preferably as thin as possible. When the resist mask 420 is thin, a surface on which the resist mask is formed is preferably as flat as possible. In the method for manufacturing the semiconductor device of this embodiment, the unevenness due to the base insulating film 432 and the like can be reduced by planarization treatment such as a polishing treatment (i.e. CMP treatment), etching (dry etching or wet etching) treatment, plasma treatment, or the like of the base insulating film 432 and the like; thus, the resist mask can be thin. This facilitates the exposure to an electron beam.

Figure 2C:
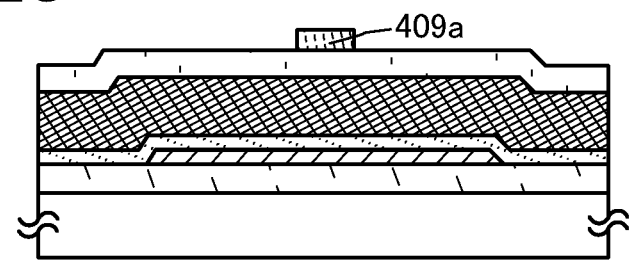

Next, the hard mask film 409 is selectively etched and a hard mask film 409a is formed (see FIG. 2C). Further, the resist mask 420 is removed after etching. In this embodiment, the resist mask 420 is removed; however the present invention is not limited thereto. The resist mask 420 is almost eliminated; therefore, it may be left.

Figure 2D:
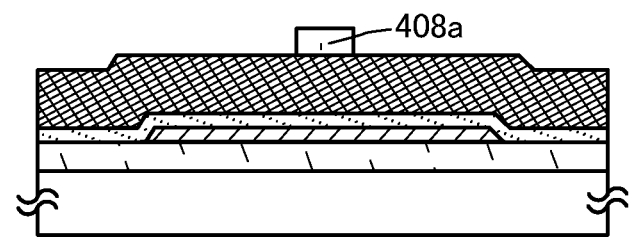

Next, the hard mask film 408 is selectively etched with the use of the hard mask film 409a as a mask, and a hard mask film 408a is formed (see FIG. 2D). Further, the hard mask film 409a is removed after etching. The hard mask film 409a is not necessarily removed similar to the resist mask 420; it may be left.

Figure 3A:
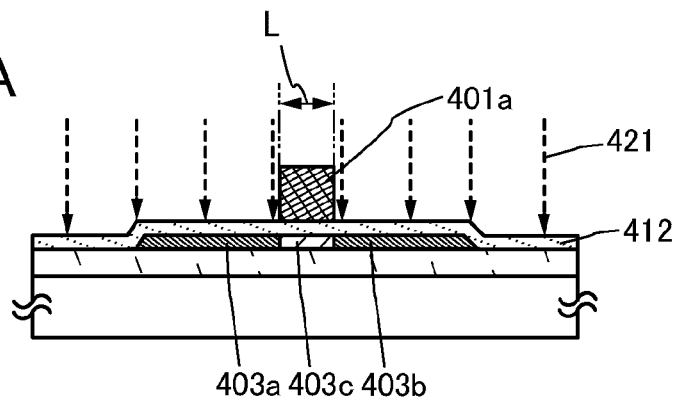
FIGS. 3A to 3D are cross-sectional views illustrating the manufacturing process of the semiconductor device according to one embodiment of the present invention.

Then, the conductive film 401 is etched with the use of the hard mask film 408a as a mask, and the gate electrode 401a is formed (see FIG. 3A). Further, the hard mask film 408a may be removed after etching. Here, a region in the oxide semiconductor film 403 over which the gate electrode 401a is formed will become a channel formation region of the transistor 450. Since the channel length L can be determined by the exposure to an electron beam, a transistor with a small channel length, e.g., a channel length greater than or equal to 1 nm and less than or equal to 30 nm, can be manufactured.

Next, treatment for adding an impurity 421 to the oxide semiconductor film 403 is performed with the use of the gate electrode 401a as a mask, so that the low-resistance region 403a, the low-resistance region 403b, and the channel formation region 403c may be formed in a self-aligned manner (see FIG. 3A).

As the impurity 421 to be added is phosphorus, boron, nitrogen, arsenic, argon, aluminum, indium, a molecular ion containing any of the above element, or the like is used. As a method for adding the impurity 421 to the oxide semiconductor film 403, an ion doping method or an ion implantation method can be used.

The treatment for adding the impurity 421 to the oxide semiconductor film 403 may be performed plural times. In the case where the treatment for adding the impurity 421 to the oxide semiconductor film 403 is performed plural times, the kind of the impurity 421 may be the same in the plural treatments or different in every treatment.

The dose of the impurity 421 is preferably $1 \times 10^{13}$ ions/cm$^2$ to $5 \times 10^{16}$ ions/cm$^2$. When phosphorus is added as the impurity, the acceleration voltage is preferably 0.5 kV to 80 kV. In this embodiment, phosphorus is added to the oxide semiconductor film 403 as the impurity 421 by an ion implantation method under the conditions where the acceleration voltage is 30 kV and the dose is $1.0 \times 10^{15}$ ions/cm$^2$.

The low-resistance region 403a and the low-resistance region 403b each have a higher impurity concentration than the channel formation region 403c. When the impurity concentration is increased, the carrier density of the oxide semiconductor film is increased and contact resistance between the source and drain electrodes and the oxide semiconductor film is reduced; thus, favorable ohmic contact can be obtained between the source and drain electrodes and the oxide semiconductor film.

Figure 3B:
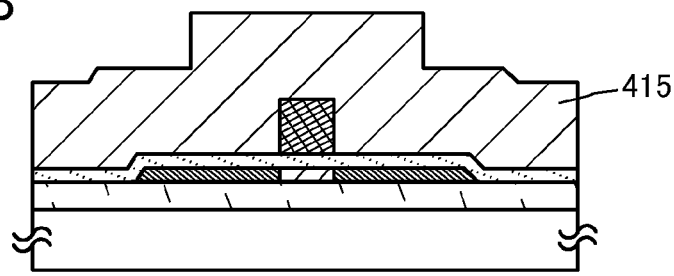

Next, the insulating film 415 is formed over the gate insulating film 412 and the gate electrode 401a (see FIG. 3B).

As a material for the insulating film 415, silicon oxide, gallium oxide, aluminum oxide, zirconium oxide, yttrium oxide, hafnium oxide, lanthanum oxide, neodymium oxide, tantalum oxide, silicon nitride, silicon oxynitride, aluminum oxynitride, silicon nitride oxide, or the like can be used. Note that the insulating film 415 may have a single-layer structure or a stacked-layer structure.

Moreover, an aluminum oxide film is preferably provided in the insulating film 415 which is in contact with the gate insulating film 412 and the gate electrode 401a. In particular, it is preferable to use an aluminum oxide film with a film density of higher than or equal to 3.2 g/cm$^3$, preferably higher than or equal to 3.6 g/cm$^3$. The aluminum oxide film has a thickness greater than or equal to 30 nm and less than or equal to 150 nm, preferably greater than or equal to 50 nm and less than or equal to 100 nm. When the film density of the aluminum oxide film is higher than or equal to the above mentioned density, moisture or hydrogen can be prevented from entering and diffusing into the oxide semiconductor film. In addition, release of oxygen from the oxide semiconductor film 403 can be suppressed.

Figure 3C:
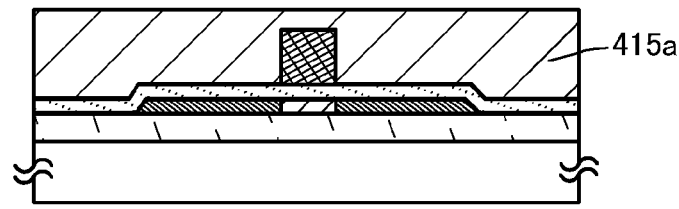

Next, removing (polishing) treatment is performed on a part of the insulating film 415 while the gate electrode 401a is not exposed and an insulating film 415a is formed (see FIG. 3C). In this embodiment, the removing treatment is performed so that the insulating film 415a having a thickness of 100 nm is formed over the gate electrode 401a.

For the removing treatment, chemical mechanical polishing (CMP) treatment can be preferably used.

Note that the CMP treatment is used as the removing treatment in this embodiment; however, another removing treatment may be used. Alternatively, the polishing treatment such as the CMP treatment may be combined with etching (dry etching or wet etching) treatment or plasma treatment. When the removing treatment is combined with etching treatment, plasma treatment, or the like, the order of steps is not particularly limited and may be set as appropriate depending on the materials, the film thicknesses, and the surface roughness of the insulating film 415. Alternatively, a large part of the insulating film 415 may be removed by CMP treatment and other part of the insulating film 415 may be removed by dry etching treatment.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the surface of the insulating film 415 can be further improved.

With the above-described structure, the height of the gate electrode region can become high by using the insulating film 415a, a sidewall insulating film can be formed on a side surface of a gate electrode 401a later, and the source electrode and the drain electrode can be easily separated from each other.

Figure 3D:
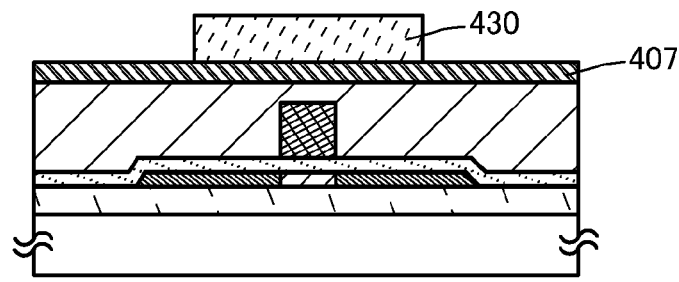

Next, an anti-reflective film 407 is formed over the insulating film 415a, a resist is formed over the anti-reflective film 407, and a resist mask 430 overlapping with the low-resistance regions 403a and 403b, and the channel formation region 403c is selectively formed by exposing the resist to an electron beam (see FIG. 3D).

The anti-reflective film 407 may be formed to have a single-layer or stacked-layer structure using one or more of Al, Ti, Cr, Co, Zr, Mo, Ta, and W, a nitride of any of these elements, an oxide of any of these elements, and an alloy of any of these elements. Alternatively, an oxide or an oxynitride which contains at least In and Zn may be used. For example, an In—Ga—Zn—O—N-based material can be used. In this embodiment, as the anti-reflective film 407, a tungsten film having a thickness of 30 nm is formed.

The anti-reflective film 407 is provided under the resist so as not to reflect or transmit the light in exposing. By providing an anti-reflective film under the resist, accuracy of forming a pattern after the exposure and development can be improved.

Further, a hard mask film (a stacked film in which an amorphous silicon film is stacked over a silicon nitride oxide film or a silicon oxide film) is preferably formed over the anti-reflective film 407 similar to the formation of the gate electrode 401a. With such a structure, etching selectivity of the anti-reflective film 407 to the resist mask is high even if the resist mask is thin; therefore, it is easy to form a pattern of a lower layer using a patterned film thereover as a mask.

Further, the conditions for the resist mask 420 can be referred to for the conditions for the exposure to an electric beam.

Figure 4A:
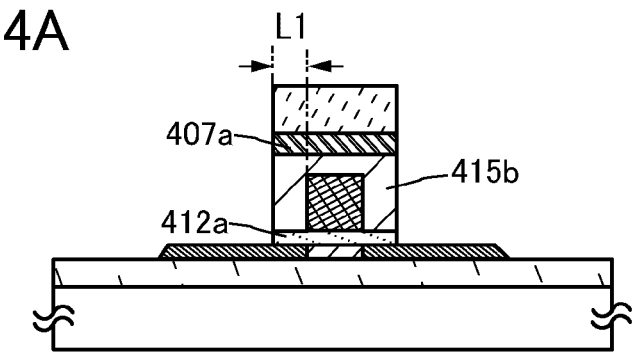
FIGS. 4A to 4D are cross-sectional views illustrating the manufacturing process of the semiconductor device according to one embodiment of the present invention.

Next, the anti-reflective film 407, the insulating film 415a, and the gate insulating film 412 are etched, whereby an anti-reflective film 407a, the insulating film 415b, and the gate insulating film 412a each having an island shape are formed (see FIG. 4A). Here, the distance L1 in the drawing can be determined by the exposure to an electric beam; therefore, a resistance between the gate electrode 401a and a region (contact region) in which the oxide semiconductor film 403 is in contact with the source electrode 405a (or the drain electrode 405b), which is formed later, is reduced and on-state characteristics of the transistor 450 can be improved. For example, a transistor in which the distance L1 in the drawing is less than or equal to 30 nm can be manufactured.

Figure 4B:
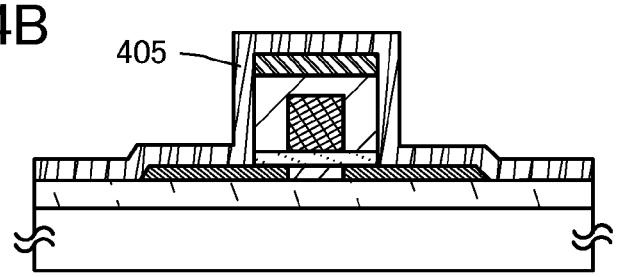

Next, the resist mask 430 is removed and a conductive film 405 is formed over the base insulating film 432, the low-resistance region 403a, the low-resistance region 403b, and the anti-reflective film 407a (see FIG. 4B).

The conductive film 405 may be formed to have a single-layer or stacked-layer structure using one or more of Al, Ti, Cr, Co, Ni, Cu, Y, Zr, Mo, Ag, Ta, Ru, and W, a nitride of any of these elements, an oxide of any of these elements, and an alloy of any of these elements. Alternatively, an oxide or an oxynitride which contains at least In and Zn may be used. For example, an In—Ga—Zn—O—N-based material can be used. In this embodiment, a tungsten film with a thickness of 30 nm is formed.

Figure 4C:
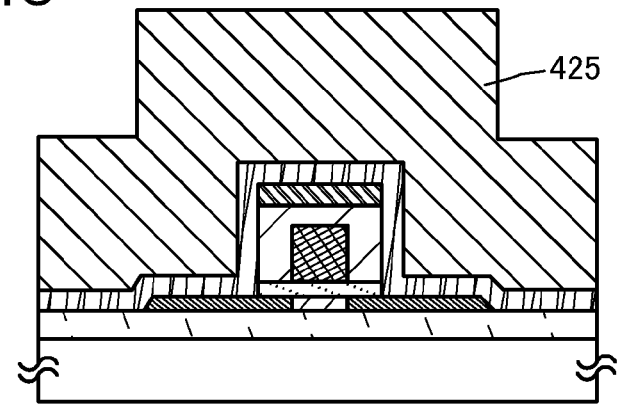

Next, an insulating film 425 is formed over the conductive film 405 (see FIG. 4C).

As a material for the insulating film 425, silicon oxide, gallium oxide, aluminum oxide, zirconium oxide, yttrium oxide, hafnium oxide, lanthanum oxide, neodymium oxide, tantalum oxide, silicon nitride, silicon oxynitride, aluminum oxynitride, silicon nitride oxide, or the like can be used. The insulating film 425 may have a single-layer structure or a stacked-layer structure.

Moreover, an aluminum oxide film is preferably provided in the insulating film 425 which is in contact with the conductive film 405. In particular, it is preferable to use an aluminum oxide film with a film density of higher than or equal to 3.2 g/cm$^3$, preferably higher than or equal to 3.6 g/cm$^3$. The aluminum oxide film has a thickness greater than or equal to 30 nm and less than or equal to 150 nm, preferably greater than or equal to 50 nm and less than or equal to 100 nm. When the film density of the aluminum oxide film is within the above range, moisture or hydrogen can be prevented from entering and diffusing into the oxide semiconductor film. In addition, release of oxygen from the oxide semiconductor film 403 can be suppressed.

Figure 4D:
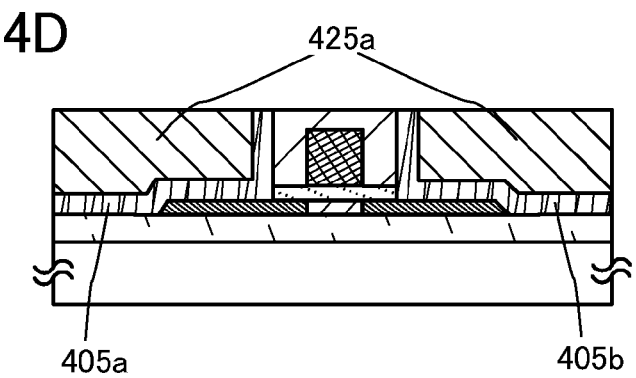

Next, removing (polishing) treatment is performed on parts of the insulating film 425 and the conductive film 405, and the anti-reflective film 407a so that the insulating film 415b is exposed, and the insulating film 425a, the source electrode 405a, and the drain electrode 405b are formed by processing the insulating film 425 and the conductive film 405 (see FIG. 4D).

For the removing treatment, chemical mechanical polishing (CMP) treatment can be preferably used.

Note that in this embodiment, the heights of top surfaces of the source electrode 405a and the drain electrode 405b are substantially the same as the heights of top surfaces of the insulating film 415b and the insulating film 425a. Note that, "the heights of top surfaces of the source electrode 405a and the drain electrode 405b are substantially the same as the heights of top surfaces of the insulating film 415b and the insulating film 425a" in this embodiment includes the case where the difference between the heights of top surfaces of the source electrode 405a and the drain electrode 405b and the heights of top surfaces of the insulating film 415b and the insulating film 425a is within 10% of the height of the gate electrode region and less than or equal to 20 nm. With such a structure, coverage of a thin film formed in a later step (a manufacturing step or the like of a semiconductor device or an electronic device including the transistor 450) can be improved, so that disconnection of a thin film or a wiring can be prevented. For example, if there is a step between the top surfaces of the source electrode 405a and the drain electrode 405b and the top surfaces of the insulating film 415b and the insulating film 425a, a film or a wiring over the step is cut and the defect occurs; however, if the top surfaces of the source electrode 405a and the drain electrode 405b and the top surfaces of the insulating film 415b and the insulating film 425a are substantially the same, such a defect can be prevented and the reliability can be improved.

Further, if the step is slight as coverage of a film or a wiring formed in a later process is not impaired, there is no problem even if the heights of top surfaces of the source electrode 405a and the drain electrode 405b are slightly different from the heights of top surfaces of the insulating film 415b and the insulating film 425a.

Note that the CMP treatment is used as the removing treatment in this embodiment; however, another removing treatment may be used. Alternatively, the polishing treatment such as the CMP treatment may be combined with etching (dry etching or wet etching) treatment or plasma treatment. In the case where the removing treatment is combined with etching treatment, plasma treatment or the like, the order of the steps is not particularly limited, and may be set as appropriate depending on the material, thickness, and roughness of the surface of the insulating film 425. Alternatively, a large part of the insulating film 425 may be removed by CMP treatment and other part of the insulating film 425 may be removed by dry etching treatment.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the surface of the insulating film 425 can be further improved.

As described above, the removing treatment is performed so that the insulating film 415b is exposed, whereby the source electrode 405a and the drain electrode 405b can be formed.

With the above-described structure, the height of the gate electrode region can become high by using the insulating film 415b and a sidewall insulating film can be formed on a side surface of a gate electrode 401a at the same time. Thus, when removing (polishing) treatment is performed on a conductive film which is to be a source electrode and a drain electrode, the conductive film is processed, and the source electrode 405a and the drain electrode 405b can be easily separated from each other.

Further, the length of the gate electrode 401a in the channel length direction can be determined by the exposure to an electron beam. Here, a region of the oxide semiconductor film 403, which overlaps with the gate electrode 401a becomes a channel formation region of the transistor. That is, since the channel length L can be determined by the exposure to an electron beam, a transistor with a small channel length can be manufactured.

Further, the source electrode 405a and the drain electrode 405b are provided in contact with the exposed portion of a top surface of the oxide semiconductor film 403 and the insulating film 415b. Therefore, the distance L1 between the gate electrode 401a and the region (contact region) in which the oxide semiconductor film 403 is in contact with the source electrode 405a (or the drain electrode 405b) can be determined by the exposure to an electron beam, so that the resistance between the gate electrode 401a and the region (contact region) in which the oxide semiconductor film 403 is in contact with the source electrode 405a (or the drain electrode 405b) is reduced; thus, the on-state characteristics of the transistor 450 can be improved.

Therefore, a semiconductor device which is miniaturized and has good electrical characteristics and a method for manufacturing the semiconductor device can be provided.

The methods and structures described in this embodiment can be combined as appropriate with any of the methods and structures described in the other embodiments.

Embodiment 2

In this embodiment, a structure of a semiconductor device in one embodiment of the present invention, which is different from that in Embodiment 1, will be described.

Figure 5A:
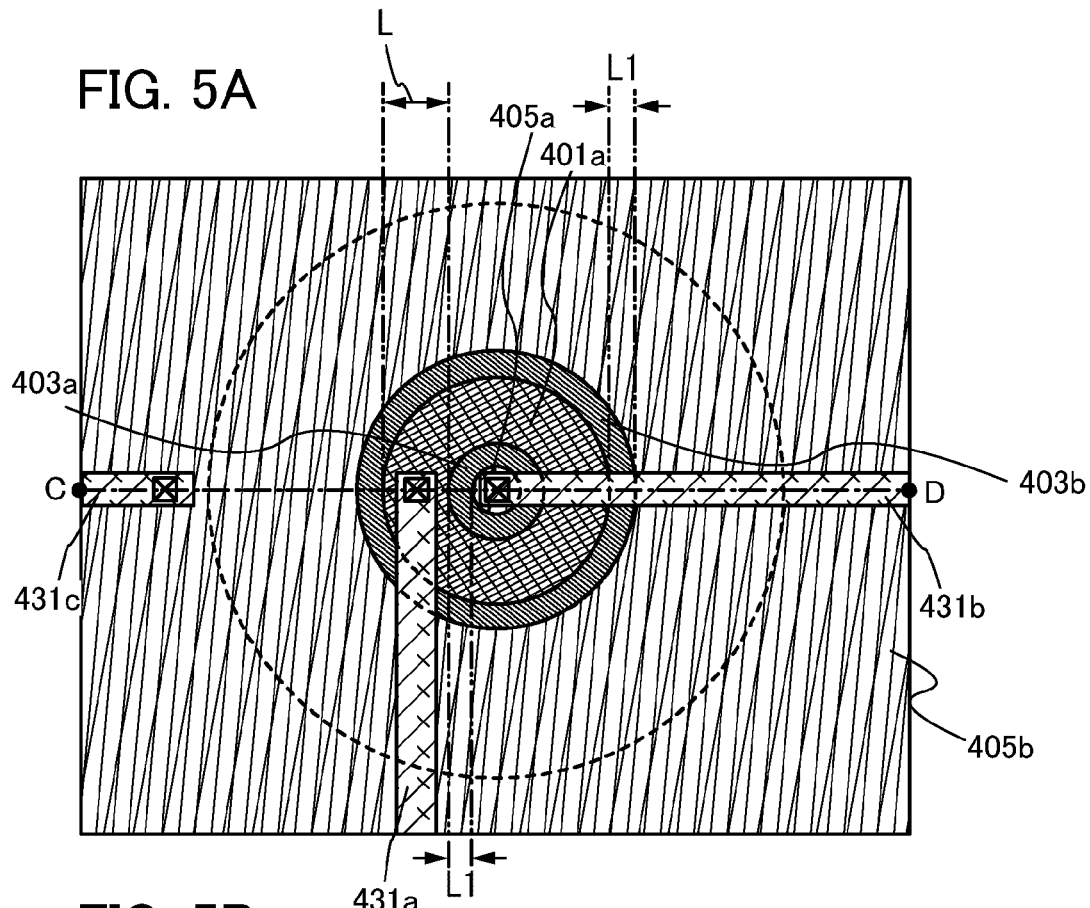
FIGS. 5A and 5B are a plan view and a cross-sectional view illustrating a semiconductor device according to one embodiment of the present invention.
Figure 5B:
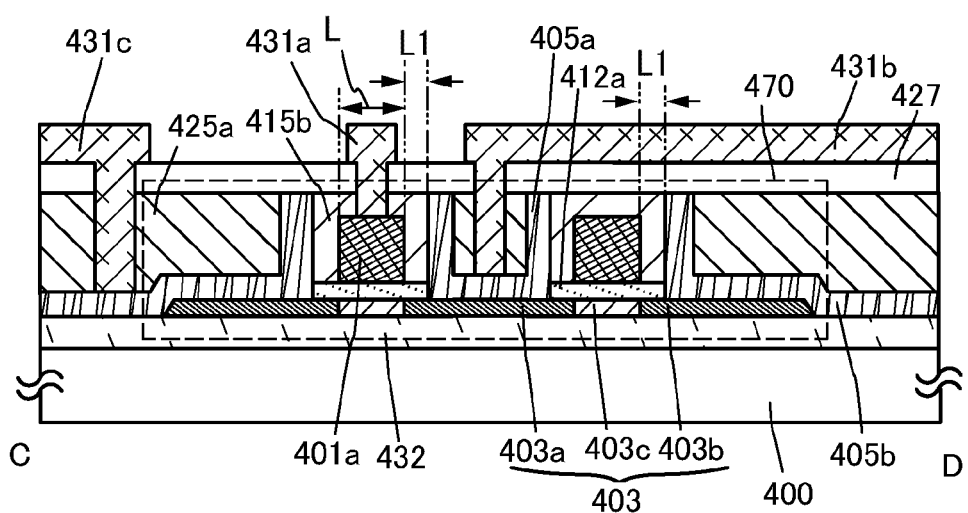

FIGS. 5A and 5B are a plan view and a cross-sectional view of a transistor 470. FIG. 5A is a plan view and FIG. 5B is a cross-sectional view taken along line C-D in FIG. 5A. Note that in FIG. 5A, some components (e.g., a base insulating film 432) of the transistor 470 are omitted to avoid complexity.

Note that, in this embodiment, portions that are similar to the portions in Embodiment 1 are denoted by the same reference numerals in the drawings, and detailed description thereof is omitted.

<Structure of Semiconductor Device According to this Embodiment>

FIGS. 5A and 5B are an example of a structure of a semiconductor device manufactured according to a method of this embodiment. The transistor 470 illustrated in FIGS. 5A and 5B includes a base insulating film 432 provided over a substrate 400 having an insulating surface, an oxide semiconductor film 403 including a low-resistance region 403a, a channel formation region 403c surrounding the low-resistance region 403a, and a low-resistance region 403b surrounding the channel formation region 403c over the base insulating film 432, a gate insulating film 412a over the oxide semiconductor film 403, a gate electrode 401a provided over the gate insulating film 412a and overlapping with the channel formation region 403c, an insulating film 415b over the gate insulating film 412a and the gate electrode 401a, a source electrode 405a overlapping with a part of the low-resistance region 403a, a drain electrode 405b overlapping with parts of the base insulating film 432 and the low-resistance region 403b, an insulating film 425a over the source electrode 405a and the drain electrode 405b, an interlayer insulating film 427 over the insulating film 415b, the insulating film 425a, the source electrode 405a, and the drain electrode 405b, and a wiring layer 431a, a wiring layer 431b, and a wiring layer 431c which are electrically connected to the gate electrode 401a, the source electrode 405a, and the drain electrode 405b, respectively, through openings provided in the insulating film 415b and the insulating film 425a.

In the drawings, although the semiconductor device has a structure in which the source electrode 405a is provided in the center of the semiconductor device and the gate electrode 401a and the drain electrode 405b are provided in the periphery of the source electrode 405a, the structure of a semiconductor device is not limited to this. An arrangement of the components can be changed as appropriate as long as a function of the semiconductor device is not negatively affected.

<Manufacturing Method of Semiconductor Device According to this Embodiment>

A method for manufacturing the transistor 470 will be described. Note that the description of points similar to that in Embodiment 1 is omitted.

The substrate 400, the base insulating film 432, the oxide semiconductor film 403, and the gate insulating film (which is to be the gate insulating film 412a) which are included in the transistor 470 each can be formed using a material and a method similar to those in Embodiment 1.

After the gate insulating film is formed, a conductive film which is to be the gate electrode 401a is formed over the gate insulating film. The conductive film can be formed using a material and a method similar to those in Embodiment 1.

A hard mask film and a resist are formed in this order over the conductive film to be the gate electrode 401a and the resist is patterned through exposure to an electron beam; thus, a mask is formed. Further, the hard mask film may be a single layer or a stacked layer. The hard mask film can be formed using a material and a method similar to those in Embodiment 1.

The hard mask film is selectively etched using the mask formed of the resist; thus, an island-shaped hard mask film is formed. Moreover, the conductive film is selectively etched using the island-shaped hard mask film as a mask; thus, the gate electrode 401a is formed. Here, a region of the oxide semiconductor film 403 overlapping with the gate electrode 401a will become a channel formation region of the transistor 470. Since the channel length L can be determined by the exposure to an electron beam, a transistor with a small channel length, e.g., a channel length greater than or equal to 1 nm and less than or equal to 30 nm, can be manufactured.

The channel length of the transistor 470 is preferably equal in any part of the transistor. Since the shape of the channel formation region of the transistor of this embodiment includes a curved line, it is preferable to form the curved line by exposure to an electron beam so as to be smooth and so as to have an equal line width.

In order to form a smooth curved line with an equal line width by exposure to an electron beam, there is a method for exposure of a curved line by rotating a stage overlapping with a substrate thereon, for example. With a linearly movable stage, a resist mask can also be patterned so that the channel length of the transistor becomes equal, by using a method in which the size or direction of a figure for dividing electron beam writing regions is optimized in accordance with the pattern of the electron beam, a multi-pass writing method in which a figure is shifted by a uniform width and writing is performed with an overlap so that the amount of light exposure of a pattern becomes equal, or the like. It is preferable to use the above method or the like to form a resist mask with an equal line width so that the channel length of the transistor 470 becomes equal.

After the gate electrode 401a is formed, an insulating film (which is to be the insulating film 415b) is formed over the gate insulating film and the gate electrode 401a. The insulating film can be formed using a material and a method similar to that in Embodiment 1.

Next, removing (polishing) treatment is performed on a part of the insulating film, an anti-reflective film which prevents reflection of the light in exposing and a resist are formed over the insulating film on which the removing treatment has been performed, and a sidewall insulating film is formed on a side surface of a gate electrode 401a by etching. At the same time, the height of the gate electrode region becomes high by using the insulating film which forms the sidewall insulating film. The removing treatment can be performed in a manner similar to that in Embodiment 1, and the anti-reflective film and the resist can be formed each using a material and a method similar to those in Embodiment 1.

Next, a conductive film which is to be the source electrode 405a and the drain electrode 405b is formed over the base insulating film 432, the low-resistance region 403a, and the low-resistance region 403b, which have been exposed by etching, and the anti-reflective film and an insulating film (which is to be the insulating film 425a) is formed over the conductive film. The anti-reflective film and the insulating film can be formed each using a material and a method similar to those in Embodiment 1.

Then, removing (polishing) treatment is performed until the anti-reflective film is removed completely, so that the source electrode 405a and the drain electrode 405b are formed. The insulating film 425a is formed at the same time.

Here, the source electrode 405a and the drain electrode 405b are provided in contact with a top surface of the oxide semiconductor film 403 which is exposed and the insulating film 415b. Therefore, the distance L1 between the gate electrode 401a and the region (contact region) in which the oxide semiconductor film 403 is in contact with the source electrode 405a (or the drain electrode 405b) can be determined by the exposure to an electron beam, so that the resistance between the gate electrode 401a and the region (contact region) in which the oxide semiconductor film 403 is in contact with the source electrode 405a (or the drain electrode 405b) is reduced; thus, the on-state characteristics of the transistor 470 can be improved.

Next, the interlayer insulating film 427 is formed over the insulating film 415b, the insulating film 425a, the source electrode 405a, and the drain electrode 405b, the insulating film 415b, the insulating film 425a, and the interlayer insulating film 427 are etched; thus, openings reaching the gate electrode 401a, the source electrode 405a, and the drain electrode 405b, respectively, are formed.

Then, a conductive film is formed in the openings and over the interlayer insulating film 427 and the conductive film is etched, whereby the wiring layer 431a, the wiring layer 431b, and the wiring layer 431c which are electrically connected to the gate electrode 401a, the source electrode 405a, and the drain electrode 405b, respectively, can be formed.

In the transistor 470 described in this embodiment, the length of the gate electrode 401a in the channel length direction is determined by using the resist obtained by the exposure to an electric beam as a mask. Precise exposure and development using an electron beam can provide a precise pattern.

With the above-described structure, the height of the gate electrode region can become high by using the insulating film 415b and a sidewall insulating film can be formed on a side surface of a gate electrode 401a at the same time. Thus, when removing (polishing) treatment is performed on a conductive film which is to be a source electrode and a drain electrode, the source electrode 405a and the drain electrode 405b can be easily separated from each other.

Further, the length of the gate electrode 401a in the channel length direction can be determined by the exposure to an electron beam. Here, a region of the oxide semiconductor film 403, which overlaps with the gate electrode 401a becomes a channel formation region of the transistor. That is, since the channel length L can be determined by the exposure to an electron beam, a transistor with a small channel length can be manufactured.

Further, the source electrode 405a and the drain electrode 405b are provided in contact with the exposed portion of a top surface of the oxide semiconductor film 403 and the insulating film 415b. Therefore, the distance L1 between the gate electrode 401a and the region (contact region) in which the oxide semiconductor film 403 is in contact with the source electrode 405a (or the drain electrode 405b) can be determined by the exposure to an electron beam, so that the resistance between the gate electrode 401a and the region (contact region) in which the oxide semiconductor film 403 is in contact with the source electrode 405a (or the drain electrode 405b) is reduced; thus, the on-state characteristics of the transistor 470 can be improved.

Furthermore, in the transistor 470, only one of the source and drain electrode is connected to the end portion of the oxide semiconductor film which tends to become less resistive; thus, a transistor in which a parasitic channel is not easily formed and which has excellent electrical characteristics can be provided.

Therefore, a semiconductor device which is miniaturized and has good electrical characteristics and a method for manufacturing the semiconductor device can be provided.

The methods and structures described in this embodiment can be combined as appropriate with any of the methods and structures described in the other embodiments.

Embodiment 3

In this embodiment, an example of a semiconductor device which includes the transistor described in Embodiment 1, can hold stored data even when not powered, and does not have a limitation on the number of write cycles will be described with reference to drawings. Note that a transistor 162 included in the semiconductor device in this embodiment is the transistor 450 described in Embodiment 1.

Figure 6A:
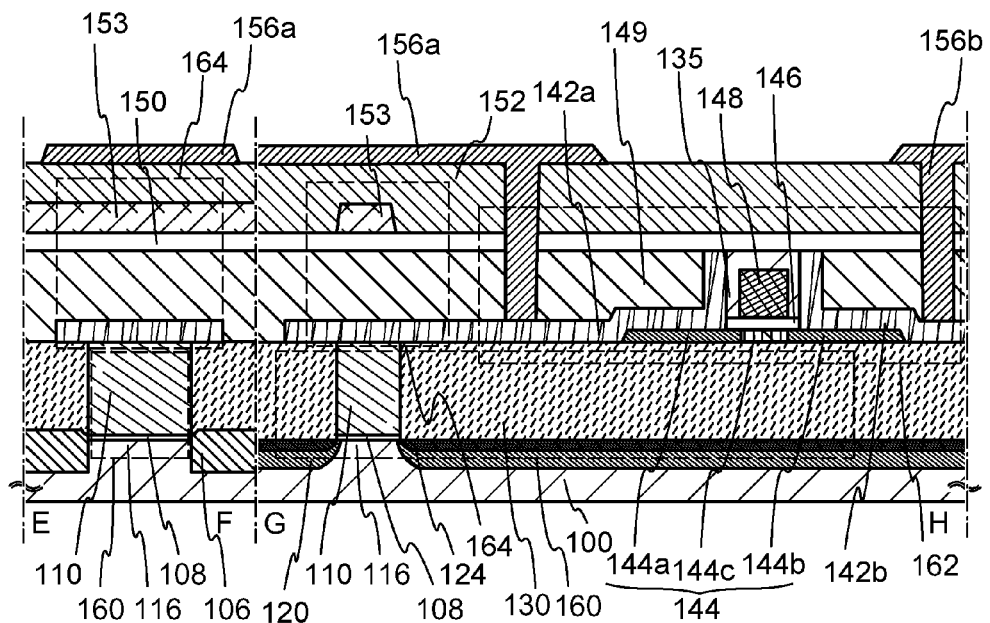
FIGS. 6A to 6C are a cross-sectional view, a plan view, and a circuit diagram illustrating one embodiment of a semiconductor device.
Figure 6B:
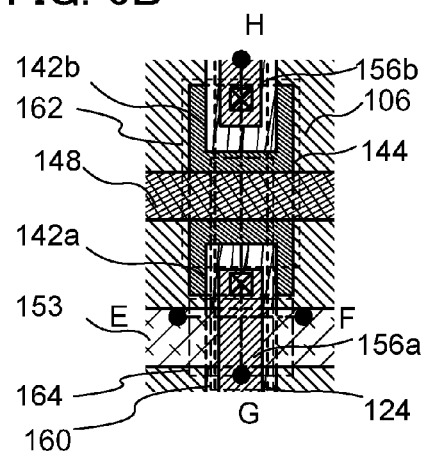
Figure 6C:
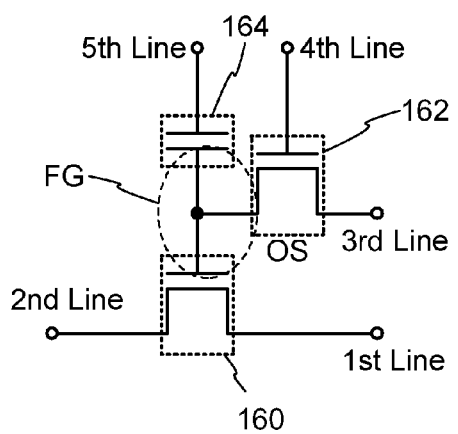

FIGS. 6A to 6C illustrate an example of a structure of a semiconductor device. FIG. 6A is a cross-sectional view of the semiconductor device, FIG. 6B is a plan view of the semiconductor device, and FIG. 6C is a circuit diagram of the semiconductor device. Here, FIG. 6A corresponds to cross sections taken along line E-F and line G-H in FIG. 6B.

The semiconductor device illustrated in FIGS. 6A and 6B includes a transistor 160 including a first semiconductor material in a lower portion, and the transistor 162 including a second semiconductor material in an upper portion. The transistor 162 has the same structure as the transistor 450 described in Embodiment 1.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

The transistor 162 includes an oxide semiconductor and thus has small off-state current; thus, the use of the transistor 162 enables stored data to be held for a long time. In other words, a semiconductor device in which refresh operation is not needed or the frequency of refresh operation is extremely low can be provided, which results in a sufficient reduction in power consumption.

Although all the transistors are n-channel transistors here, p-channel transistors can also be used. The technical feature of the disclosed invention is to use an oxide semiconductor in the transistor 162 so that data can be held; therefore, it is not necessary to limit a specific structure of the semiconductor device, such as a material of the semiconductor device or a structure of the semiconductor device, to the structure described here.

The transistor 160 in FIG. 6A includes a channel formation region 116 provided in a substrate 100 including a semiconductor material (e.g., silicon), impurity regions 120 provided such that the channel formation region 116 is sandwiched therebetween, intermetallic compound regions 124 in contact with the impurity regions 120, a gate insulating film 108 provided over the channel formation region 116, and a gate electrode 110 provided over the gate insulating film 108. Note that a transistor whose source electrode and drain electrode are not illustrated in a drawing may be referred to as a transistor for convenience. Further, in such a case, in description of a connection of a transistor, a source region and a source electrode may be collectively referred to as a "source electrode," and a drain region and a drain electrode may be collectively referred to as a "drain electrode." That is, in this specification, the term "source electrode" may include a source region.

An element isolation insulating film 106 is formed over the substrate 100 so that the transistor 160 is surrounded by the element isolation insulating film 106. An insulating film 130 is formed so that the transistor 160 is covered with the insulating film 130. Note that for higher integration, the transistor 160 preferably has a structure without a sidewall insulating film as illustrated in FIG. 6A. On the other hand, when the characteristics of the transistor 160 have priority, the sidewall insulating films may be formed on side surfaces of the gate electrode 110, so that the impurity regions 120 each include regions having different impurity concentrations.

The transistor 162 illustrated in FIG. 6A includes an oxide semiconductor in the channel formation region. An oxide semiconductor film 144 includes low-resistance regions 144a and 144b and a channel formation region 144c and a gate insulating layer 146 is formed over the oxide semiconductor film. The channel formation region 144c is sandwiched between the low-resistance regions 144a and 144b.

In a manufacturing step of the transistor 162, an insulating film 135 including a sidewall insulating film on a side surface of a gate electrode 148 is formed in a step of removing the insulating film provided over the gate electrode 148 by chemical mechanical polishing treatment. Further, at the same time, the height of the gate electrode region can become high by using the insulating film which forms the sidewall insulating film.

Therefore, in the transistor 162, the height of the gate electrode region can become high, whereby when the removing (polishing) treatment is performed on a conductive film which is to be a source electrode and a drain electrode, the source electrode and the drain electrode can be easily separated from each other.

Further, the length of the gate electrode 148 in the channel length direction can be determined by the exposure to an electron beam. Here, a region of the oxide semiconductor film, which overlaps with the gate electrode 148 becomes a channel formation region of the transistor. That is, since the channel length L can be determined by the exposure to an electron beam, a transistor with a small channel length, e.g., a channel length greater than or equal to 1 nm and less than or equal to 30 nm, can be manufactured.

Further, the source electrode 142a and the drain electrode 142b are provided in contact with the exposed portion of a top surface of the oxide semiconductor film 144 and the insulating film 135. Therefore, the distance between the gate electrode 148 and the region (contact region) in which the oxide semiconductor film 144 is in contact with the source electrode 142a (or the drain electrode 142b) can be determined by the exposure to an electron beam, so that the resistance between the gate electrode 148 and the region (contact region) in which the oxide semiconductor film 144 is in contact with the source electrode 142a (or the drain electrode 142b) is reduced; thus, the on-state characteristics of the transistor 162 can be improved. For example, a transistor in which a distance between the gate electrode 148 and a region (contact region) in which the oxide semiconductor film 144 is in contact with the source electrode 142a (or the drain electrode 142b) is greater than or equal to 1 nm and less than or equal to 30 nm can be manufactured.

An interlayer insulating film 149 and an insulating film 150 each having a single-layer structure or a stacked-layer structure are provided over the transistor 162. In this embodiment, an aluminum oxide film is used as the insulating film 150. When the aluminum oxide film has high density (film density of 3.2 g/cm$^3$ or more, preferably 3.6 g/cm$^3$ or more), the transistor 162 can have stable electric characteristics.

Further, a conductive film 153 is provided in a region overlapping with the source electrode 142a with the interlayer insulating film 149 and the insulating film 150 provided therebetween. The source electrode 142a, the interlayer insulating film 149, the insulating film 150, and the conductive film 153 constitute a capacitor 164. That is, the source electrode 142a functions as one electrode of the capacitor 164 and the conductive film 153 functions as the other electrode of the capacitor 164. Note that the capacitor 164 may be omitted if a capacitor is not needed. Alternatively, the capacitor 164 may be separately provided above the transistor 162.

An insulating film 152 is provided over the transistor 162 and the capacitor 164. Further, wirings 156a and 156b for connecting the transistor 162 to another transistor are provided over the insulating film 152. The wiring 156a is electrically connected to the source electrode 142a through the electrode formed in an opening formed in the interlayer insulating film 149, the insulating film 150, and the insulating film 152. The wiring 156b is electrically connected to the source electrode 142b through the electrode formed in an opening formed in the interlayer insulating film 149, the insulating film 150, and the insulating film 152.

In FIGS. 6A and 6B, the transistor 160 is provided so as to overlap with at least part of the transistor 162. The source region or the drain region of the transistor 160 is preferably provided so as to overlap with part of the oxide semiconductor film 144. Further, the transistor 162 and the capacitor 164 are provided so as to overlap with at least part of the transistor 160. For example, the conductive film 153 of the capacitor 164 is provided so as to overlap with at least part of the gate electrode 110 of the transistor 160. When such a planar layout is employed, the area occupied by the semiconductor device can be reduced; thus, the degree of integration can be increased.

FIG. 6C illustrates an example of a circuit configuration corresponding to FIGS. 6A and 6B.

In FIG. 6C, a first wiring (1st Line) is electrically connected to a source electrode of the transistor 160. A second wiring (2nd Line) is electrically connected to a drain electrode of the transistor 160. A third wiring (3rd Line) is electrically connected to one of a source electrode and a drain electrode of the transistor 162. A fourth wiring (4th Line) is electrically connected to a gate electrode of the transistor 162. A gate electrode of the transistor 160 and the other of the source electrode and the drain electrode of the transistor 162 are electrically connected to one electrode of the capacitor 164. A fifth wiring (5th Line) is electrically connected to the other electrode of the capacitor 164.

The semiconductor device in FIG. 6C utilizes a characteristic in which the potential of the gate electrode of the transistor 160 can be held, and thus can write, hold, and read data as described below.

Writing and holding of data will be described. First, the potential of the fourth wiring is set to a potential at which the transistor 162 is turned on, so that the transistor 162 is turned on. Thus, the potential of the third wiring is supplied to a node (node FG) to which the gate electrode of the transistor 160 and the capacitor 164 are connected. In other words, predetermined charge is supplied to the node FG (data writing). Here, charge for supply of a potential level or charge for supply of a different potential level (hereinafter referred to as low-level charge and high-level charge) is given. After that, the potential of the fourth wiring is set to a potential at which the transistor 162 is turned off, so that the transistor 162 is turned off. Thus, the charge given to the node FG is held (data holding).

Since the off-state current of the transistor 162 is extremely small, the charge of the gate electrode of the transistor 160 is held for a long time.

Next, reading of data will be described. When an appropriate potential (reading potential) is supplied to the fifth wiring while a predetermined potential (fixed potential) is supplied to the first wiring, the potential of the second wiring varies depending on the amount of charge held in the node FG. This is generally because when the transistor 160 is an n-channel transistor, apparent threshold voltage $V_{th\_H}$ in the case where a high-level charge is supplied to the node FG (also referred to as the gate electrode of the transistor 160) is lower than apparent threshold voltage $V_{th\_L}$ in the case where a low-level charge is supplied to the node FG. Here, the apparent threshold voltage refers to the potential of the fifth wiring, which is needed to turn on the transistor 160. Thus, the potential of the fifth wiring is set to a potential $V_0$ between $V_{th\_H}$ and $V_{th\_L}$, whereby charge supplied to the node FG can be determined. For example, in the case where a high-level charge is supplied in writing, when the potential of the fifth wiring is $V_0$ ($>V_{th\_H}$), the transistor 160 is turned on. In the case where a low-level charge is supplied in writing, even when the potential of the fifth wiring is $V_0$ ($<V_{th\_L}$), the transistor 160 remains off. Therefore, the data held can be read by measuring the potential of the second wiring.

Note that in the case where memory cells are arrayed, only data of desired memory cells need to be read. In the case where such reading is not performed, a potential at which the transistor 160 is turned off regardless of the state of the gate electrode of the transistor 160, that is, a potential smaller than $V_{th\_H}$ may be supplied to the fifth wiring. Alternatively, a potential at which the transistor 160 is turned on regardless of the state of the gate electrode, that is, a potential higher than $V_{th\_L}$ may be supplied to the fifth wiring.

When a transistor which includes a channel formation region formed using an oxide semiconductor and has extremely small off-state current is applied to the semiconductor device in this embodiment, the semiconductor device can hold data for an extremely long period. In other words, refresh operation is not needed or the frequency of the refresh operation can be extremely low, which results in a sufficient reduction in power consumption. Moreover, stored data can be held for a long time even during a period in which power is not supplied (the potential is preferably fixed).

Further, the semiconductor device described in this embodiment does not need high voltage for writing data and has no problem of deterioration of elements. For example, unlike a conventional non-volatile memory, it is not necessary to inject and extract electrons into and from a floating gate; thus, a problem such as deterioration of a gate insulating film does not occur at all. In other words, the semiconductor device according to one embodiment of the present invention does not have a limit on the number of write cycles, which is a problem in a conventional nonvolatile memory, and reliability thereof is drastically improved. Furthermore, data is written depending on the on state or the off state of the transistor, whereby high-speed operation can be easily achieved.

Further, in the transistor 162, the low-resistance region 144a (or the low-resistance region 144b) in the oxide semiconductor film is in contact with the source electrode 142a (or the drain electrode 142b) to be electrically connected thereto, so that contact resistance can be reduced; thus, the transistor 162 can have excellent electric characteristics (e.g., high on-state current). Therefore, the use of the transistor 162 allows higher performance of the semiconductor device. Moreover, the transistor 162 has high reliability; thus, higher reliability of the semiconductor device can be achieved.

The structures, methods, and the like described in this embodiment can be combined as appropriate with any of the structures, methods, and the like described in the other embodiments.

Embodiment 4

In this embodiment, a semiconductor device which includes the transistor described in Embodiment 1, can hold stored data even when not powered, does not have a limitation on the number of write cycles, and has a structure different from the structure described in Embodiment 3 will be described with reference to FIGS. 7A and 7B and FIGS. 8A and 8B. Note that the transistor 162 included in the semiconductor device in this embodiment is the transistor described in Embodiment 1. Any of the structures of the transistors described in previously-cited Embodiments can be employed for the transistor 162.

Figure 7A:
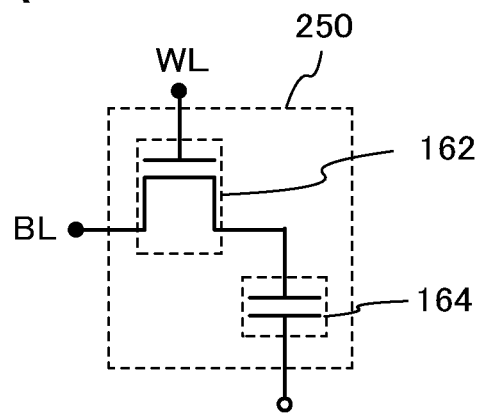
FIGS. 7A and 7B are a circuit diagram and a perspective view illustrating one embodiment of a semiconductor device.
Figure 7B:
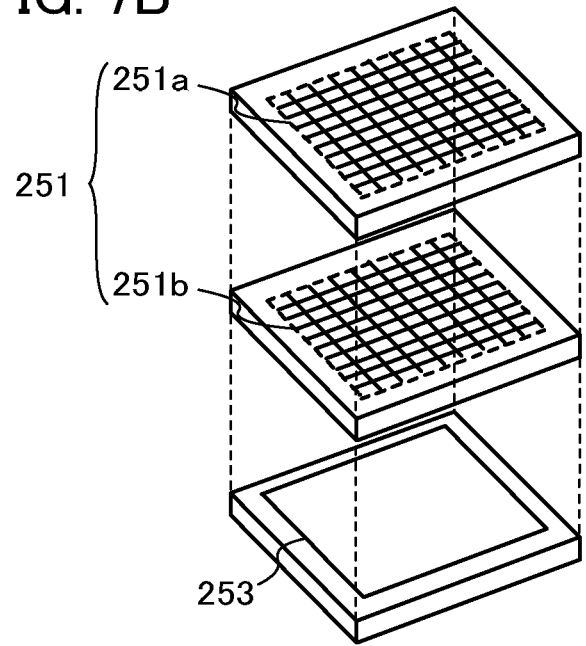

FIG. 7A illustrates an example of a circuit configuration of a semiconductor device, and FIG. 7B is a conceptual diagram illustrating an example of a semiconductor device. First, the semiconductor device illustrated in FIG. 7A will be described, and then the semiconductor device illustrated in FIG. 7B will be described.

In the semiconductor device illustrated in FIG. 7A, a bit line BL is electrically connected to one of the source electrode or the drain electrode of the transistor 162, a word line WL is electrically connected to the gate electrode of the transistor 162, and the other of the source electrode or the drain electrode of the transistor 162 is electrically connected to a first terminal of a capacitor 164.

Moreover, the transistor 162 including an oxide semiconductor has extremely small off-state current. For that reason, the potential of the first terminal of the capacitor 164 (or charge accumulated in the capacitor 164) can be held for an extremely long period by turning off the transistor 162.

Next, writing and holding of data in the semiconductor device (a memory cell 250) illustrated in FIG. 7A will be described.

First, the potential of the word line WL is set to a potential at which the transistor 162 is turned on, so that the transistor 162 is turned on. Thus, the potential of the bit line BL is supplied to the first terminal of the capacitor 164 (data writing). After that, the potential of the word line WL is set to a potential at which the transistor 162 is turned off, so that the transistor 162 is turned off. Thus, the potential at the first terminal of the capacitor 164 is held (data holding).

Since the off-state current of the transistor 162 is extremely small, the potential of the first terminal of the capacitor 164 (or the charge accumulated in the capacitor) can be held for a long time.

Next, reading of data will be described. When the transistor 162 is turned on, the bit line BL which is in a floating state and the capacitor 164 are electrically connected to each other, and the charge is redistributed between the bit line BL and the capacitor 164. As a result, the potential of the bit line BL changes. The amount of change in the potential of the bit line BL varies depending on the potential of the first terminal of the capacitor 164 (or the charge accumulated in the capacitor 164).

For example, the potential of the bit line BL after charge redistribution is $(C_B \times V_{B0} + C \times V)/(C_B + C)$, where V is the potential of the first terminal of the capacitor 164, C is the capacitance of the capacitor 164, $C_B$ is the capacitance of the bit line BL (hereinafter also referred to as "bit line capacitance"), and $V_{B0}$ is the potential of the bit line BL before the charge redistribution. Therefore, it can be found that assuming that the memory cell 250 is in either of two states in which the potentials of the first terminal of the capacitor 164 are $V_1$ and $V_0$ ($V_1 > V_0$), the potential of the bit line BL in the case of holding the potential $V_1$ (=$(C_B \times V_{B0} + C \times V_1)/(C_B + C)$) is higher than the potential of the bit line BL in the case of holding the potential $V_0$ (=$(C_B \times V_{B0} + C \times V_0)/(C_B + C)$).

Then, by comparison between the potential of the bit line BL and a predetermined potential, data can be read.

As described above, the semiconductor device illustrated in FIG. 7A can hold charge that is accumulated in the capacitor 164 for a long time because the off-state current of the transistor 162 is extremely small. In other words, refresh operation is not needed or the frequency of refresh operation can be extremely low, which results in a sufficient reduction in power consumption. Moreover, stored data can be held for a long time even during a period in which power is not supplied.

Next, the semiconductor device illustrated in FIG. 7B will be described.

The semiconductor device illustrated in FIG. 7B includes a memory cell array 251 (memory cell arrays 251a and 251b) including a plurality of memory cells 250 illustrated in FIG. 7A as memory circuits in the upper portion, and a peripheral circuit 253, which is necessary for operating the memory cell arrays 251a and 251b, in the lower portion. Note that the peripheral circuit 253 is electrically connected to the memory cell array 251a and the memory cell array 251b.

In the structure illustrated in FIG. 7B, the peripheral circuit 253 can be provided directly under the memory cell arrays 251a and 251b. Thus, a reduction in the size of the semiconductor device can be achieved.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 7B illustrates, as an example, the semiconductor device in which two memory cell arrays, the memory cell array 251a and the memory cell array 251b, are stacked; however, the number of memory cell arrays to be stacked is not limited thereto. Three or more memory cell arrays may be stacked.

Next, a specific structure of the memory cell 250 illustrated in FIG. 7A will be described with reference to FIGS. 8A and 8B.

Figure 8A:
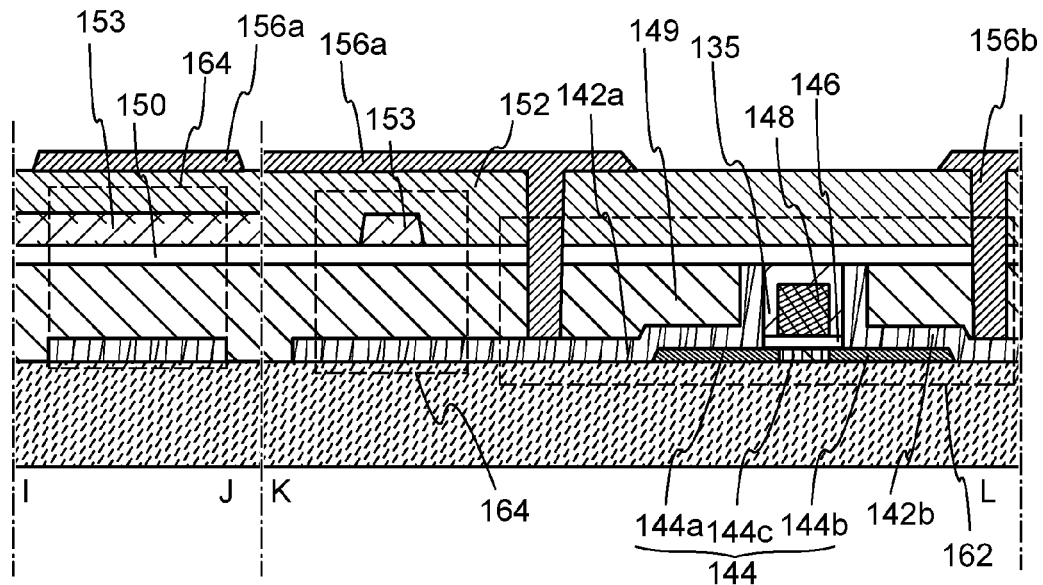
FIGS. 8A and 8B are a cross-sectional view and a plan view illustrating the one embodiment of the semiconductor device.
Figure 8B:
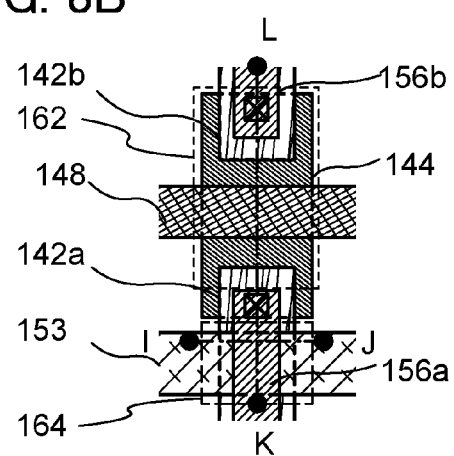

FIGS. 8A and 8B illustrate an example of a structure of the memory cell 250. FIG. 8A is a cross-sectional view of the memory cell 250, and FIG. 8B is a plan view of the memory cell 250. Here, FIG. 8A corresponds to a cross section along line I-J and line K-L in FIG. 8B.

The transistor 162 in FIGS. 8A and 8B can have the same structure as the transistor in Embodiment 1.

An interlayer insulating film 149 having a single-layer structure or a stacked-layer structure is provided over the transistor 162. In addition, a conductive film 153 is provided in a region overlapping with the source electrode 142a of the transistor 162 with the interlayer insulating film 149 and the insulating film 150 interposed therebetween, and the source electrode 142a, the interlayer insulating film 149, the insulating film 150, and the conductive film 153 form a capacitor 164. That is, the source electrode 142a of the transistor 162 functions as one electrode of the capacitor 164, and the conductive film 153 functions as the other electrode of the capacitor 164.

An insulating film 152 is provided over the transistor 162 and the capacitor 164. Further, a wiring 156a and a wiring 156b for connecting the memory cell 250 to an adjacent memory cell 250 are provided over the insulating film 152. The wiring 156a is electrically connected to the source electrode 142a through the electrode formed in an opening formed in the interlayer insulating film 149, the insulating film 150, and the insulating film 152. The wiring 156b is electrically connected to the drain electrode 142b through the electrode formed in an opening formed in the interlayer insulating film 149, and the insulating films 150 and 152. The wirings 156a and 156b may be electrically connected to the source electrode 142a and the drain electrode 142b through another conductive film provided in the opening. Note that the wirings 156a and 156b correspond to the bit line BL in the circuit diagram of FIG. 7A.

In FIGS. 8A and 8B, the drain electrode 142b of the transistor 162 can also function as a source electrode of a transistor included in an adjacent memory cell. With such a planar layout, the area occupied by the semiconductor device can be reduced; thus, higher integration can be achieved.

When the planar layout illustrated in FIG. 8B is employed, the area occupied by the semiconductor device can be reduced; thus, the degree of integration can be increased.

As described above, the plurality of memory cells formed in multiple layers in the upper portion each include a transistor including an oxide semiconductor. Since the off-state current of the transistor including an oxide semiconductor is small, stored data can be held for a long time with the use of the transistor. In other words, the frequency of refresh operation can be extremely lowered, which results in a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor with sufficiently small off-state current). Further, with a structure in which the peripheral circuit and the memory circuit are stacked, higher integration of the integration of the semiconductor device can be achieved.

As described above, a miniaturized and highly-integrated semiconductor device having high electrical characteristics and a method for manufacturing the semiconductor device can be provided.

This embodiment can be combined with any of the other embodiments as appropriate.

Embodiment 5

In this embodiment, examples of application of the semiconductor device described in any of the above embodiments to portable devices such as a mobile phone, a smartphone, or an e-book reader will be described with reference to FIGS. 9A and 9B, FIG. 10, FIG. 11, and FIG. 12.

In portable electronic devices such as a mobile phone, a smart phone, and an e-book reader, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 9A:
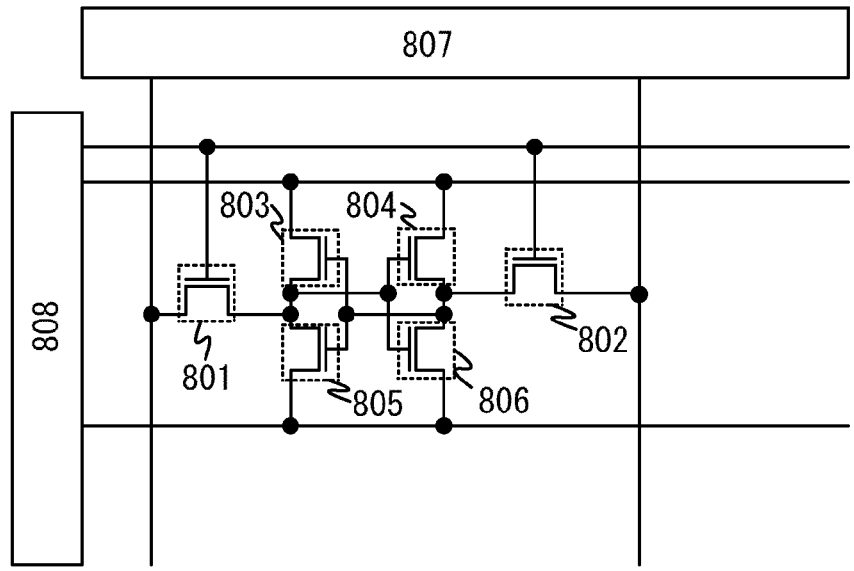
FIGS. 9A and 9B are circuit diagrams each illustrating one embodiment of a semiconductor device.

In a normal SRAM, as illustrated in FIG. 9A, one memory cell includes six transistors, which are a transistor 801, a transistor 802, a transistor 803, a transistor 804, a transistor 805, and a transistor 806, and they are driven by an X decoder 807 and a Y decoder 808. A pair of transistors 803 and 805 and a pair of the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, the price per bit of an SRAM is the highest among a variety of memory devices.

Figure 9B:
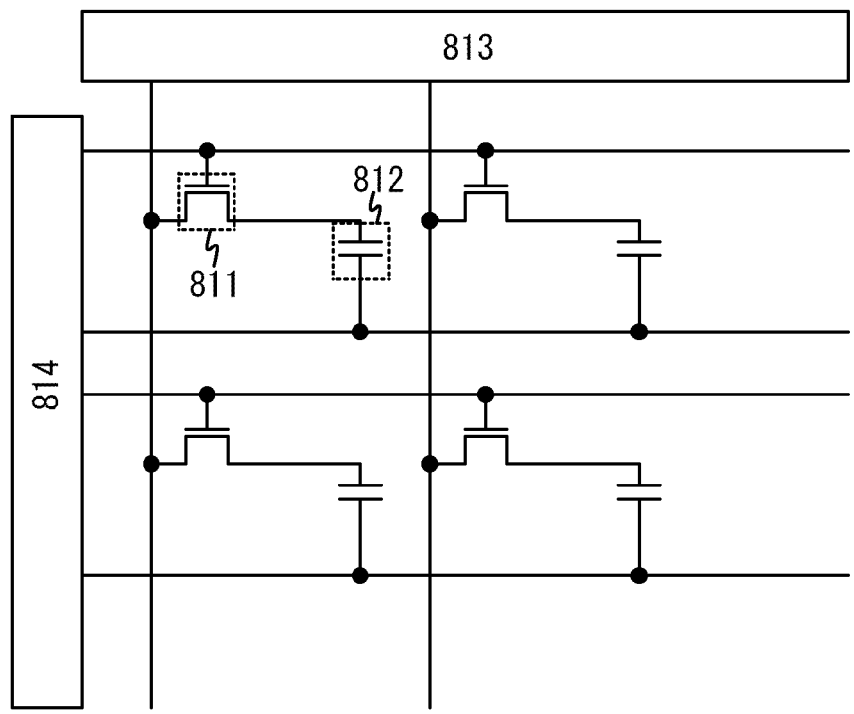

On the other hand, as illustrated in FIG. 9B, a memory cell in a DRAM includes a transistor 811 and a storage capacitor 812, and is driven by an X decoder 813 and a Y decoder 814. One cell includes one transistor and one capacitor and has a small area. The area of a memory cell in a DRAM is generally less than or equal to 10 $F^2$. Note that the DRAM needs to be refreshed periodically and consumes electric power even when a rewriting operation is not performed.

However, the area of the memory cell of the semiconductor device described in the above embodiments is about 10 $F^2$ and frequent refreshing is not needed. Therefore, the area of the memory cell can be reduced, which results in a reduction in power consumption.

Figure 10:
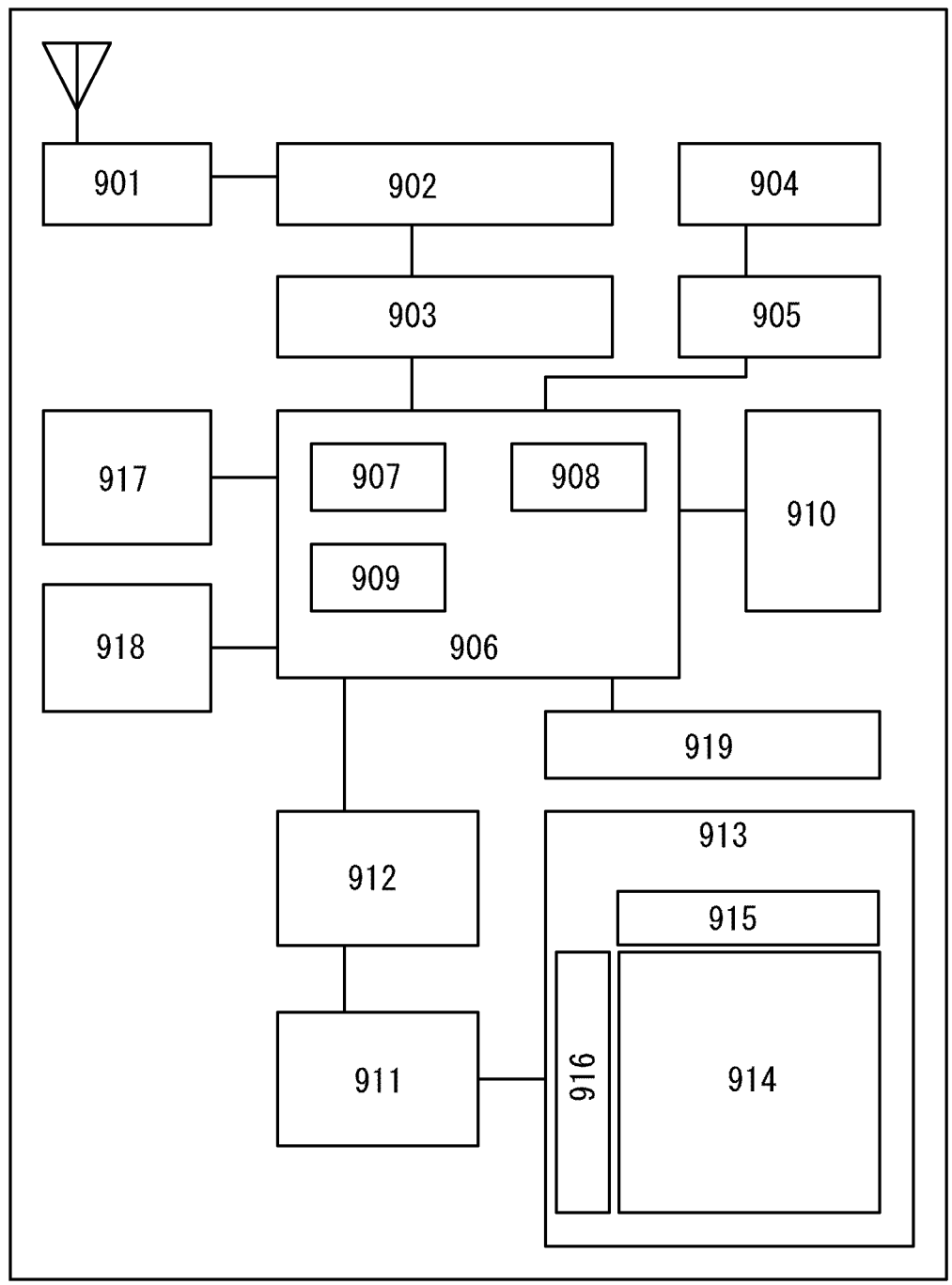
FIG. 10 is a block diagram illustrating one embodiment of a semiconductor device.

FIG. 10 is a block diagram of a portable device. A portable device illustrated in FIG. 10 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing any of the semiconductor devices described in the above embodiments for the memory circuit 912, writing and reading of data can be performed at high speed, data can be held for a long time, and power consumption can be sufficiently reduced.

Figure 11:
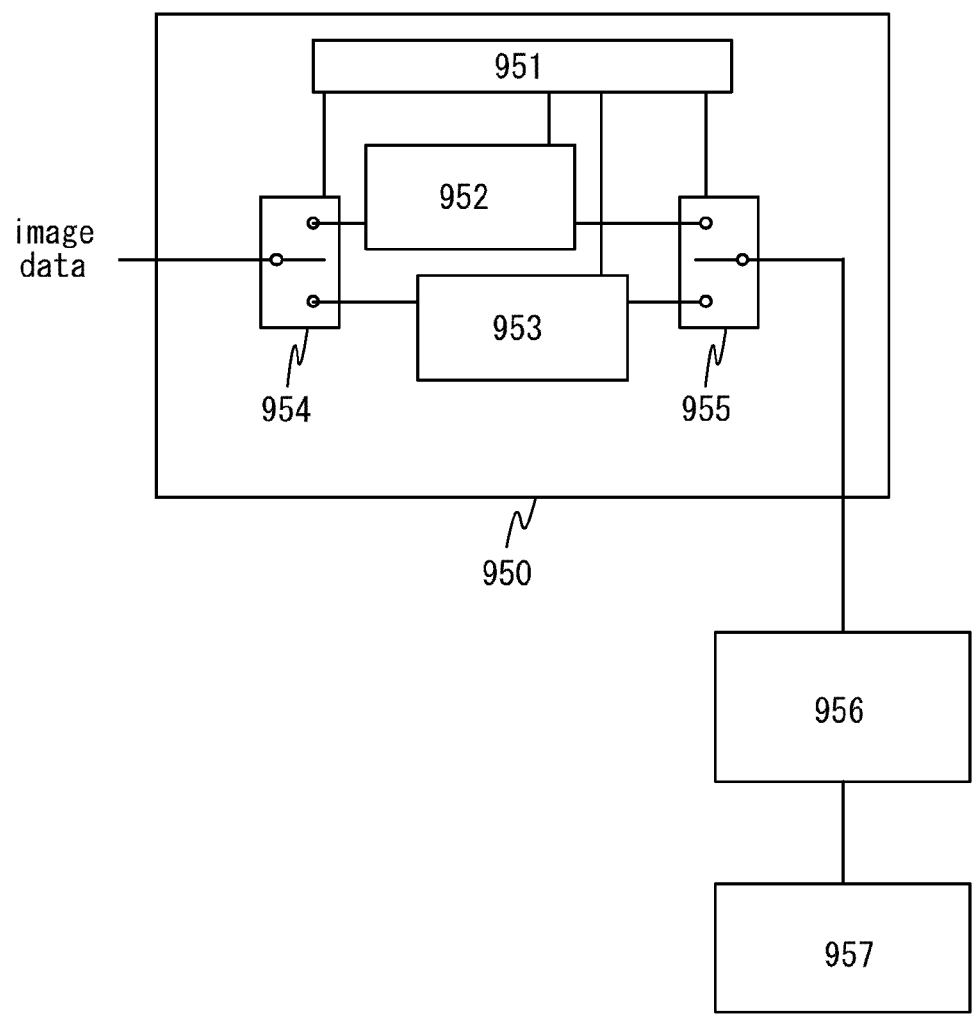
FIG. 11 is a block diagram illustrating one embodiment of a semiconductor device.

FIG. 11 illustrates an example in which any of the semiconductor devices described in the above embodiments is used for a memory circuit 950 in a display. The memory circuit 950 illustrated in FIG. 11 includes a memory 952, a memory 953, a switch 954, a switch 955, and a memory controller 951. Further, the memory circuit 950 is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 though the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another next new image data is stored in the memory 952.

By alternately writing and reading image data to and from the memory 952 and the memory 953 as described above, images are displayed on the display 957. Note that the memory 952 and the memory 953 are not necessarily separate memories and a single memory may be divided and used. By employing any of the semiconductor devices described in the above embodiments for the memory 952 and the memory 953, data can be written and read at high speed and held for a long time, and power consumption can be sufficiently reduced.

Figure 12:
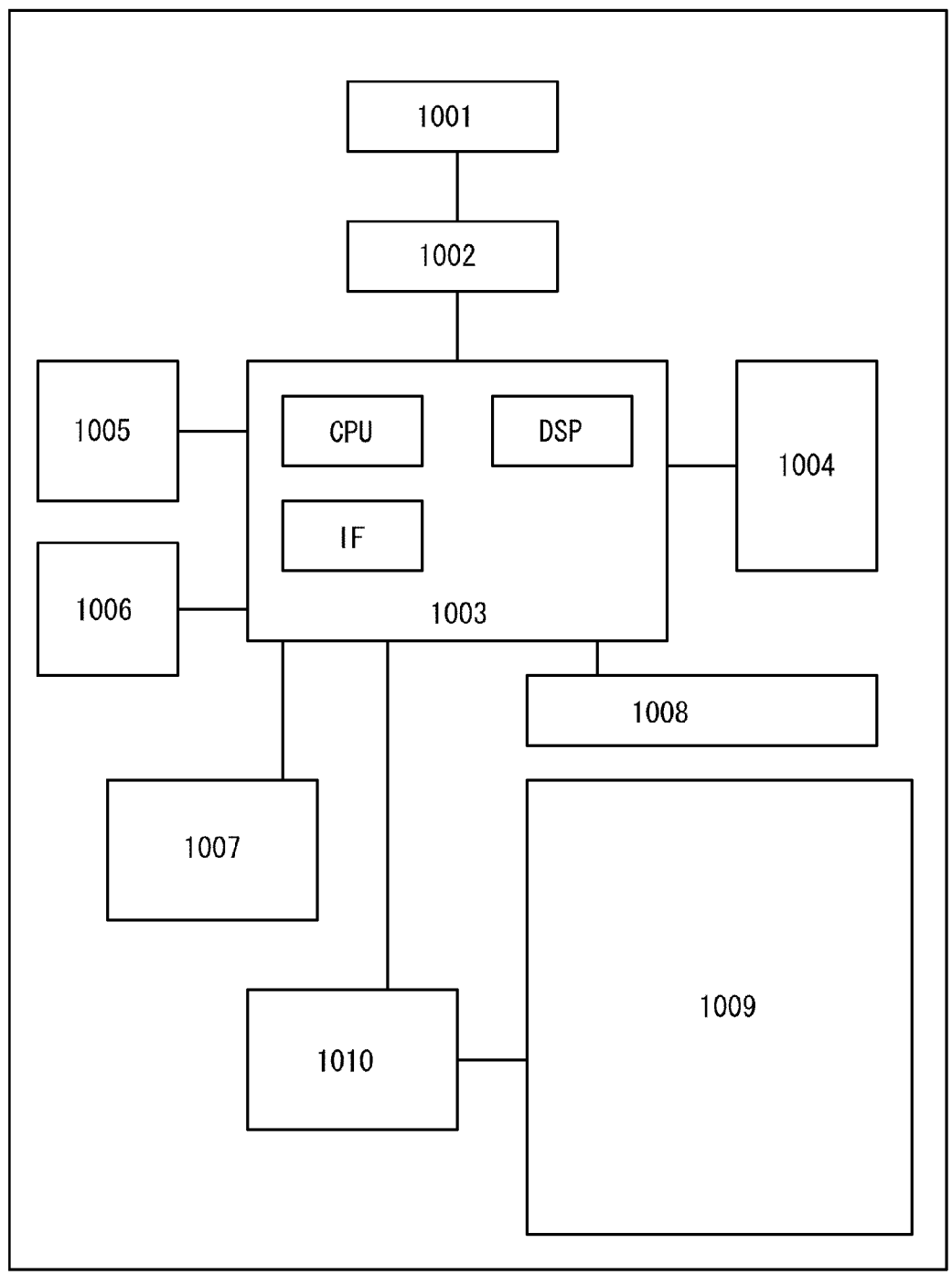
FIG. 12 is a block diagram illustrating one embodiment of a semiconductor device.

FIG. 12 is a block diagram of an e-book reader. The e-book reader in FIG. 12 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 12. The memory circuit 1007 has a function of temporarily holding the contents of a book. For example, when a user reads an e-book, the user may use a highlighting function of changing a display color, drawing an underline, using a bold font, changing the type of letter, or the like so that the specific portion is in clear contrast to the other portions. In the case where data of the portion specified by the user is held for a long time, the data may be copied to the flash memory 1004. Also in such a case, the semiconductor device described in any of the above embodiments is used, whereby writing and reading of data can be performed at high speed, data can be stored for a long time, and power consumption can be sufficiently reduced.

As described above, the semiconductor device in any of the above embodiments is mounted on each of the portable devices described in this embodiment. Thus, it is possible to obtain a portable device which is capable of reading data at high speed, storing data for a long time, and reducing power consumption.

This embodiment can be combined with any of the other embodiments as appropriate.

This application is based on Japanese Patent Application serial no. 2011-282450 filed with Japan Patent Office on Dec. 23, 2011, the entire contents of which are hereby incorporated by reference.

What is claimed is:

1. A method for manufacturing a semiconductor device, comprising the steps of:
    forming an oxide semiconductor film over an insulating surface;
    forming a gate insulating film covering the oxide semiconductor film;
    forming a first conductive film provided over the gate insulating film and overlapping with the oxide semiconductor film;
    forming a film over the first conductive film;
    forming a first resist by performing electron beam exposure over the film;
    selectively etching the film using the first resist as a mask to form a hard mask film;
    forming a gate electrode by selectively etching the first conductive film using the hard mask film as a mask;
    forming a first insulating film over the gate insulating film and the gate electrode;
    performing first removing treatment on a part of the first insulating film while the gate electrode is not exposed;
    forming an anti-reflective film over the first insulating film subjected to the first removing treatment;
    forming a second resist by performing electron beam exposure over the anti-reflective film and overlapping with the oxide semiconductor film;
    exposing parts of the insulating surface and the oxide semiconductor film to form an exposed insulating surface and oxide semiconductor film by selectively etching the anti-reflective film, the first insulating film, and the gate insulating film;
    forming a second conductive film over the exposed insulating surface and oxide semiconductor film, and the anti-reflective film;
    forming a second insulating film over the second conductive film;
    performing second removing treatment on parts of the second insulating film and the second conductive film, and the anti-reflective film so that the first insulating film is exposed; and
    forming a source electrode and a drain electrode by processing the second conductive film subjected to the second removing treatment.

2. The method for manufacturing the semiconductor device, according to claim 1, wherein the first removing treatment is performed by chemical mechanical polishing.

3. The method for manufacturing the semiconductor device, according to claim 1, wherein the second removing treatment is performed by chemical mechanical polishing.

4. The method for manufacturing the semiconductor device, according to claim 1,
    wherein the film is a stacked film of a silicon nitride oxide film and an amorphous silicon film or a stacked film of a silicon oxide film and an amorphous silicon film, and
    wherein the amorphous silicon film is formed over the silicon nitride oxide film or the silicon oxide film.

5. The method for manufacturing a semiconductor device, according to claim 1,
    wherein a second hard mask film is formed after the anti-reflective film is formed and before the second resist is formed, and
    wherein the second hard mask film is a stacked film of a silicon nitride oxide film and an amorphous silicon film or a stacked film of a silicon oxide film and an amorphous silicon film.

6. The method for manufacturing a semiconductor device, according to claim 1, wherein a channel length of the oxide semiconductor film is determined by electron beam exposure.

7. A method for manufacturing a semiconductor device, comprising the steps of:
    forming an oxide semiconductor film over an insulating surface;
    forming a gate insulating film covering the oxide semiconductor film;
    forming a first conductive film provided over the gate insulating film and overlapping with the oxide semiconductor film;
    forming a film over the first conductive film;
    forming a first resist by performing electron beam exposure over the film;
    selectively etching the film using the first resist as a mask to form a hard mask film;
    forming a gate electrode by selectively etching the first conductive film using the hard mask film as a mask;
    forming, in a self-aligned manner, a channel formation region in a region overlapping with the gate electrode in the oxide semiconductor film and a first low-resistance region and a second low-resistance region between which the channel formation region is sandwiched in the oxide semiconductor film by adding impurities;
    forming a first insulating film over the gate insulating film and the gate electrode;
    performing first removing treatment on a part of the first insulating film while the gate electrode is not exposed;
    forming an anti-reflective film over the first insulating film on which the first removing treatment is performed;
    forming a second resist by performing electron beam exposure over the anti-reflective film and overlapping with the channel formation region, the first low-resistance region, and the second low-resistance region;
    exposing a part of the insulating surface, the first low-resistance region, and the second low-resistance region by selectively etching the anti-reflective film, the first insulating film, and the gate insulating film to form an exposed insulating surface, first low-resistance region, and second low-resistance region;

forming a second conductive film over the exposed insulating surface, first low-resistance region, and second low-resistance region, and the anti-reflective film;

forming a second insulating film over the second conductive film;

performing second removing treatment on parts of the second insulating film and the second conductive film, and the anti-reflective film so that the first insulating film is exposed; and forming a source electrode and a drain electrode by processing the second conductive film on which the second removing treatment is performed.

8. The method for manufacturing the semiconductor device, according to claim 7, wherein the first removing treatment is performed by chemical mechanical polishing.

9. The method for manufacturing the semiconductor device, according to claim 7, wherein the second removing treatment is performed by chemical mechanical polishing.

10. The method for manufacturing the semiconductor device, according to claim 7,
wherein the film is a stacked film of a silicon nitride oxide film and an amorphous silicon film or a stacked film of a silicon oxide film and an amorphous silicon film, and
wherein the amorphous silicon film is formed over the silicon nitride oxide film or the silicon oxide film.

11. The method for manufacturing a semiconductor device, according to claim 7,
wherein a second hard mask film is formed after the anti-reflective film is formed and before the second resist is formed, and
wherein the second hard mask film is a stacked film of a silicon nitride oxide film and an amorphous silicon film or a stacked film of a silicon oxide film and an amorphous silicon film.

12. The method for manufacturing a semiconductor device, according to claim 7, wherein a channel length of the channel formation region is determined by electron beam exposure.

13. A method for manufacturing a semiconductor device, comprising the steps of:
forming an oxide semiconductor film over an insulating surface;
forming a gate insulating film covering the oxide semiconductor film;
forming a first conductive film provided over the gate insulating film and overlapping with the oxide semiconductor film;
forming a film over the first conductive film;
forming a first resist by performing electron beam exposure over the film;
selectively etching the film using the first resist as a mask to form a hard mask film;

forming a gate electrode by selectively etching the first conductive film using the hard mask film as a mask;

forming a first insulating film over the gate insulating film and the gate electrode;

performing first removing treatment on a part of the first insulating film while the gate electrode is not exposed;

forming an anti-reflective film over the first insulating film subjected to the first removing treatment;

forming a second resist by performing electron beam exposure over the anti-reflective film and overlapping with the oxide semiconductor film;

exposing parts of the insulating surface and the oxide semiconductor film to form an exposed insulating surface and oxide semiconductor film by selectively etching the anti-reflective film, the first insulating film, and the gate insulating film;

forming a second conductive film over the exposed insulating surface and oxide semiconductor film, and the anti-reflective film;

forming a second insulating film over the second conductive film; and performing second removing treatment on parts of the second insulating film and the second conductive film, and the anti-reflective film so that the first insulating film is exposed.

14. The method for manufacturing the semiconductor device, according to claim 13, wherein the first removing treatment is performed by chemical mechanical polishing.

15. The method for manufacturing the semiconductor device, according to claim 13, wherein the second removing treatment is performed by chemical mechanical polishing.

16. The method for manufacturing the semiconductor device, according to claim 13,
wherein the film is a stacked film of a silicon nitride oxide film and an amorphous silicon film or a stacked film of a silicon oxide film and an amorphous silicon film, and
wherein the amorphous silicon film is formed over the silicon nitride oxide film or the silicon oxide film.

17. The method for manufacturing a semiconductor device, according to claim 13,
wherein a second hard mask film is formed after the anti-reflective film is formed before the second resist is formed, and
wherein the second hard mask film is a stacked film of a silicon nitride oxide film and an amorphous silicon film or a stacked film of a silicon oxide film and an amorphous silicon film.

18. The method for manufacturing a semiconductor device, according to claim 13, wherein a channel length of the oxide semiconductor film is determined by electron beam exposure.

19. The method for manufacturing the semiconductor device, according to claim 13, wherein a source electrode and a drain electrode are formed by performing the second removing treatment.

* * * * *